US012720797B2

(12) United States Patent
Mori

(10) Patent No.: US 12,720,797 B2
(45) Date of Patent: Aug. 25, 2026

(54) SEMICONDUCTOR DEVICE

(71) Applicant: RENESAS ELECTRONICS CORPORATION, Tokyo (JP)

(72) Inventor: Takahiro Mori, Tokyo (JP)

(73) Assignee: Renesas Electronics Corportaion, Tokyo (JP)

(*) Notice: Subject to any disclaimer, the term of this patent is extended or adjusted under 35 U.S.C. 154(b) by 394 days.

(21) Appl. No.: 18/484,956

(22) Filed: Oct. 11, 2023

(65) Prior Publication Data

US 2024/0178317 A1 May 30, 2024

(30) Foreign Application Priority Data

Nov. 24, 2022 (JP) ................................ 2022-187574

(51) Int. Cl.
*H10D 30/65* (2025.01)
*H10D 30/01* (2025.01)
(Continued)

(52) U.S. Cl.
CPC ......... *H10D 30/65* (2025.01); *H10D 30/0221* (2025.01); *H10D 30/0281* (2025.01);
(Continued)

(58) Field of Classification Search
CPC ............... H10D 30/65; H10D 30/0221; H10D 30/0281; H10D 30/603; H10D 62/126;
(Continued)

(56) References Cited

U.S. PATENT DOCUMENTS 8,207,579 B2 * 6/2012 Takehiro ............ H10D 30/0285 257/E27.098
10,388,741 B2 * 8/2019 Mori .................... H10D 62/393
(Continued)

FOREIGN PATENT DOCUMENTS

JP 2010-165974 A 7/2010
JP 2017-152559 A 8/2017
JP 2019-117883 A 7/2019

OTHER PUBLICATIONS

Office Action dated Nov. 18, 2025, issued in corresponding Japan Application No. 2022-187574, 8 pages.
(Continued)

*Primary Examiner* — Earl N Taylor
(74) *Attorney, Agent, or Firm* — Rimon P.C.

(57) ABSTRACT

In a p-type substrate region of a semiconductor substrate, an n-type source region, an n-type drain region, a p-type body region having an impurity concentration higher than an impurity concentration of the p-type substrate region, a p-type body contact region having an impurity concentration higher than the impurity concentration of the p-type body region, and an n-type drift region having an impurity concentration lower than an impurity concentration of the n-type drain region are formed. A gate electrode is formed on the semiconductor substrate via a gate dielectric film. The semiconductor substrate includes a first region and a second region that are alternately disposed in an extending direction of the gate electrode. A width of the p-type body region overlapping with the gate electrode in the second region is smaller than a width of the p-type body region overlapping with the gate electrode in the first region.

19 Claims, 24 Drawing Sheets

(51) Int. Cl.
*H10D 30/60* (2025.01)
*H10D 62/10* (2025.01)
*H10D 62/17* (2025.01)

(52) U.S. Cl.
CPC ......... *H10D 30/603* (2025.01); *H10D 62/126* (2025.01); *H10D 62/393* (2025.01); *H10D 62/116* (2025.01); *H10D 62/307* (2025.01)

(58) Field of Classification Search
CPC .... H10D 62/393; H10D 84/83; H10D 62/116; H10D 62/307; H01L 29/66681; H01L 29/1095; H01L 29/0692; H01L 27/088; H01L 29/7816
See application file for complete search history.

(56) References Cited

U.S. PATENT DOCUMENTS

| | | | | |
|---|---|---|---|---|
| 2014/0035031 | A1* | 2/2014 | Yamada | H10D 62/126 438/286 |
| 2017/0250259 | A1* | 8/2017 | Mori | H10D 30/0281 |
| 2018/0331211 | A1* | 11/2018 | Huang | H10D 62/116 |
| 2018/0342577 | A1* | 11/2018 | Fujii | H10D 62/154 |

OTHER PUBLICATIONS

Office Action dated Sep. 29, 2025, issued in corresponding German Application No. 10 2023 132 762.3, 15 pages.

* cited by examiner

SEMICONDUCTOR DEVICE

CROSS-REFERENCE TO RELATED APPLICATIONS

The disclosure of Japanese Patent Application No. 2022-187574 filed on Nov. 24, 2022, including the specification, drawings and abstract is incorporated herein by reference in its entirety.

BACKGROUND

The present disclosure relates to a semiconductor device, and can be suitably used, for example, for a semiconductor device having an LDMOSFET.

As a MISFET (Metal Insulator Semiconductor Field Effect Transistor), there is an LDMOSFET (Laterally Diffused Metal-Oxide-Semiconductor Field Effect Transistor). The LDMOSFET has a high drain breakdown voltage.

There are disclosed techniques listed below.

[Patent Document 1] Japanese Unexamined Patent Application Publication No. 2019-117883

Patent Document 1 describes a technique relating to a semiconductor device having an LDMOSFET.

SUMMARY

In a MISFET such as a LDMOSFET, the threshold voltage is an important electrical characteristic, and the threshold voltage of the MISFET needs to be adjusted according to the application of semiconductor device. For this reason, adjusting the threshold voltage of the MISFET in a simple method without increasing the manufacturing cost of the semiconductor device is desired.

Other objects and novel features will become apparent from the description of this specification and the accompanying drawings.

According to one embodiment, a semiconductor device includes: a semiconductor substrate having an upper surface; a substrate region of a first conductivity type formed in the semiconductor substrate; a first MISFET formed on the upper surface of the semiconductor substrate; a first source region and a first drain region of a second conductivity type formed spaced apart from each other in the substrate region; and a first gate electrode formed on the semiconductor substrate between the first source region and the first drain region via a first gate dielectric film. The semiconductor device further includes a first semiconductor region of the first conductivity type having an impurity concentration higher than that of the substrate region, the first semiconductor region being formed in the substrate region so as to partially overlap with the first gate electrode in plan view. The semiconductor device further includes a second semiconductor region of the first conductivity type having an impurity concentration higher than that of the first semiconductor region, the second semiconductor region being formed in the substrate region so as not to overlap with the first gate electrode in plan view and so as to be adjacent to the first source region. The semiconductor device further includes a third semiconductor region of the second conductivity type having an impurity concentration lower than that of the first drain region, the third semiconductor region being formed in the substrate region so as to partially overlap with the first gate electrode in plan view, and electrically connected to the first drain region. The first gate electrode extends in a first direction, and the first semiconductor region extends in the first direction so as to cover a bottom surface of the first source region and a bottom surface of the second semiconductor region. The semiconductor substrate includes a first region and a second region that are alternately disposed in the first direction. A width of the first semiconductor region overlapping with the first gate electrode in the second region is smaller than a width of the first semiconductor region overlapping with the first gate electrode in the first region.

According to one embodiment, the threshold voltage of the MISFET can be adjusted by a simple method. In addition, the threshold voltage of the MISFET can be adjusted while the manufacturing cost of semiconductor device is suppressed.

DETAILED DESCRIPTION

Figure 1:
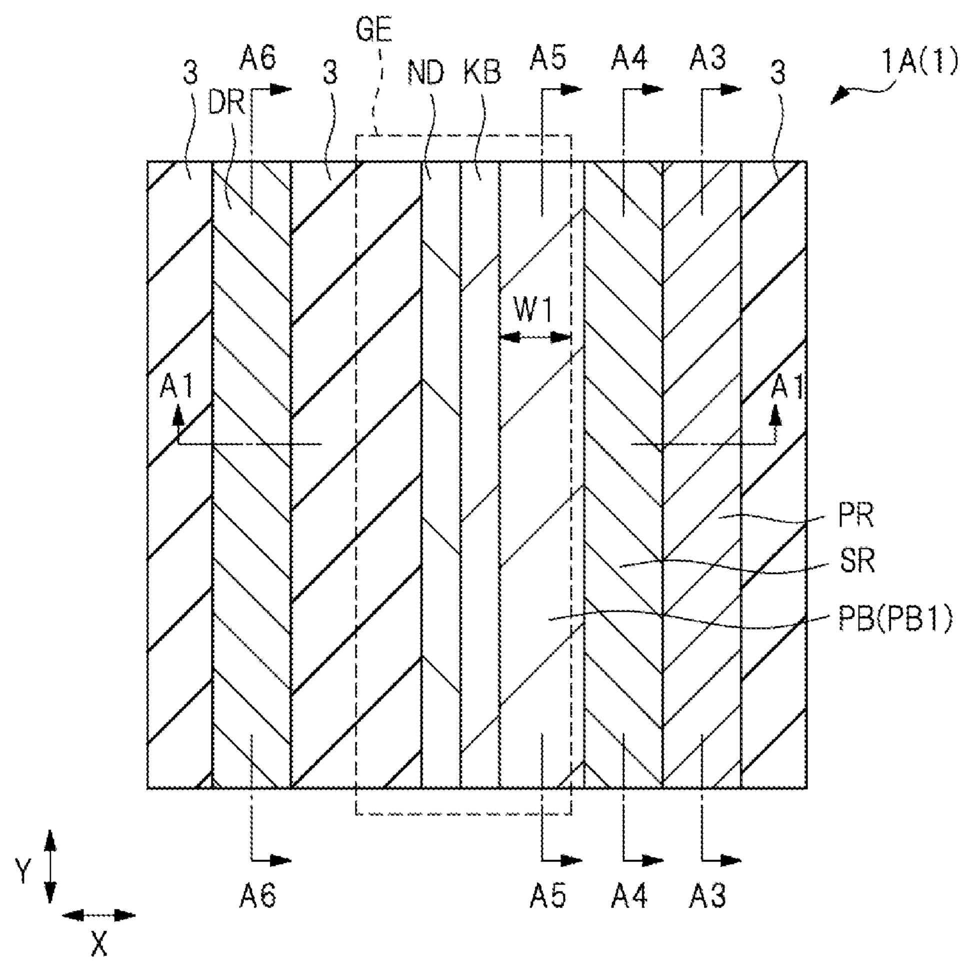
FIG. 1 is a main portion plan view of a semiconductor device of a first embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

First Embodiment

Structure of Semiconductor Device

Figure 2:
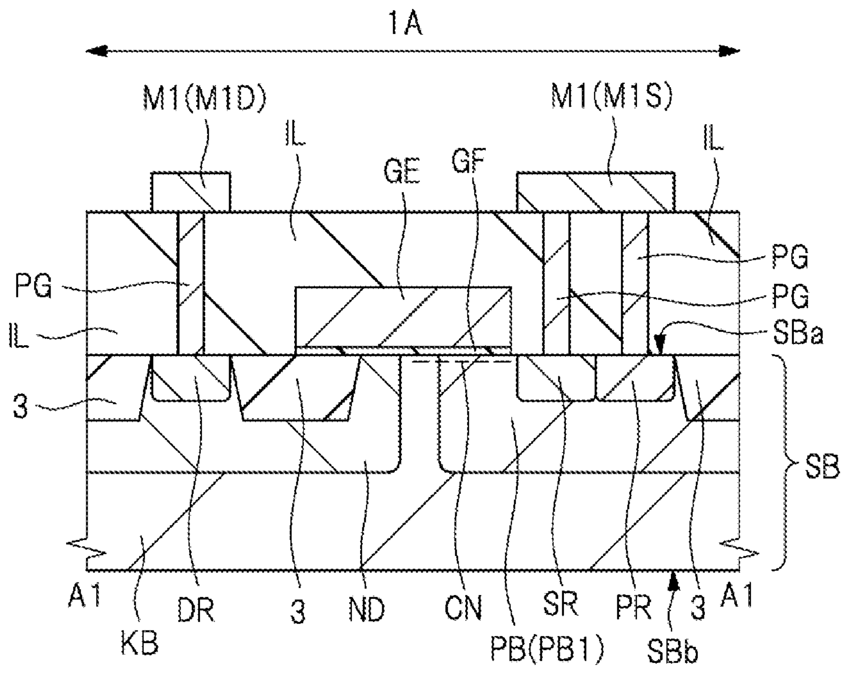
FIG. 2 is a main portion cross-sectional view of the semiconductor device of the first embodiment.
Figure 3:
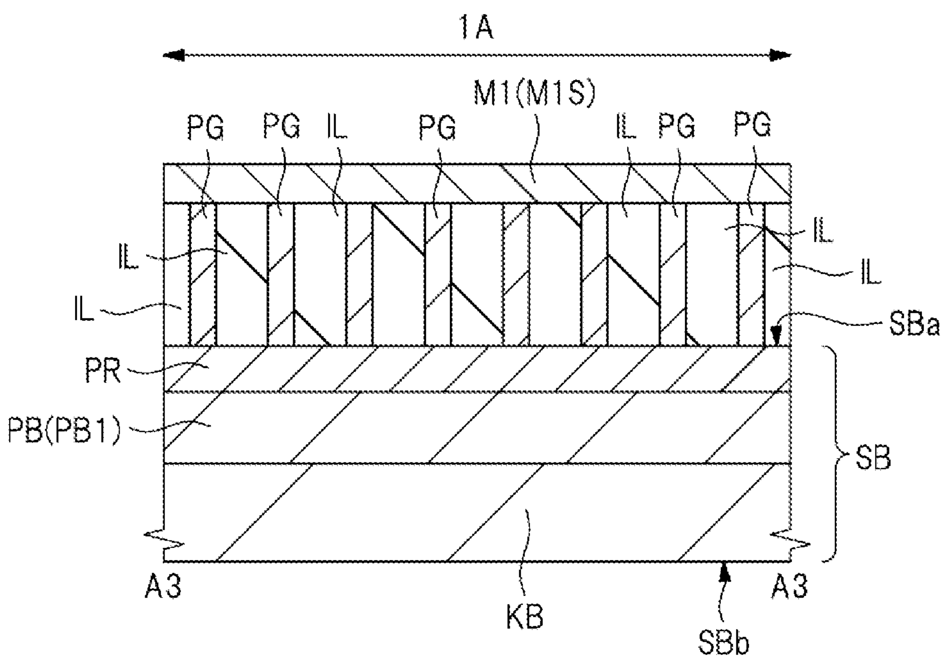
FIG. 3 is a main portion cross-sectional view of the semiconductor device of the first embodiment.
Figure 4:
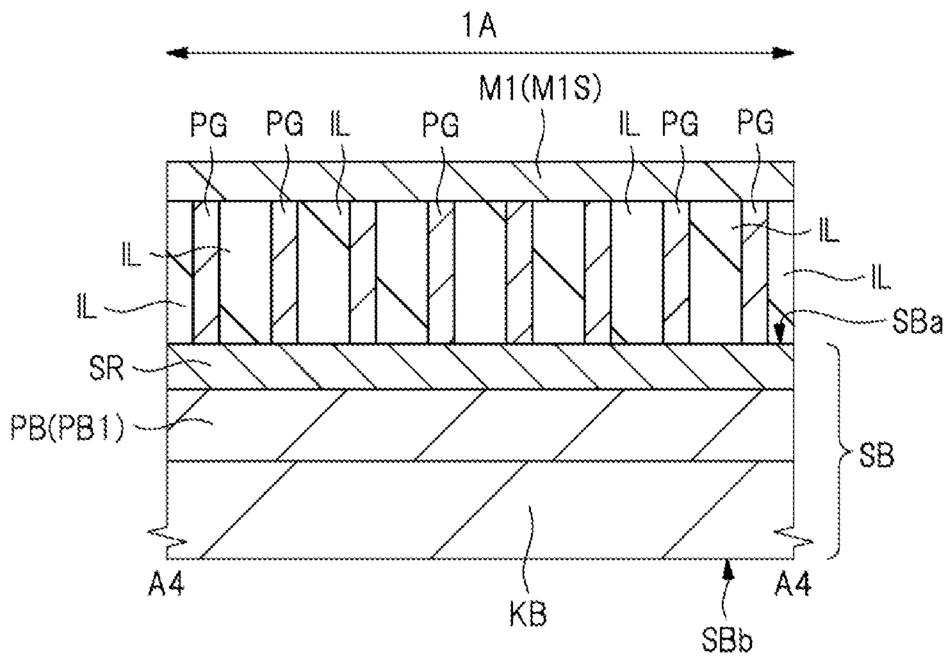
FIG. 4 is a main portion cross-sectional view of the semiconductor device of the first embodiment.
Figure 5:
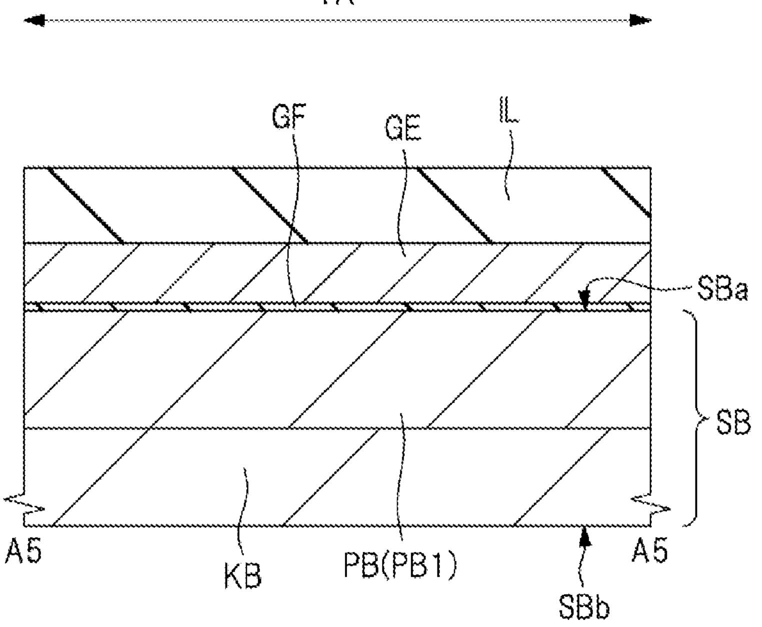
FIG. 5 is a main portion cross-sectional view of the semiconductor device of the first embodiment.
Figure 6:
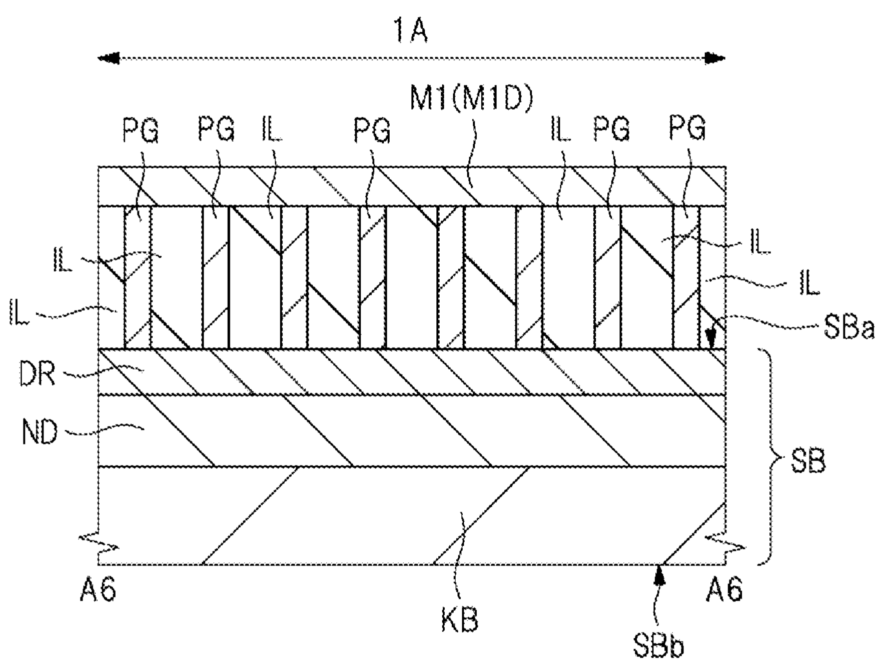
FIG. 6 is a main portion cross-sectional view of the semiconductor device of the first embodiment.
Figure 7:
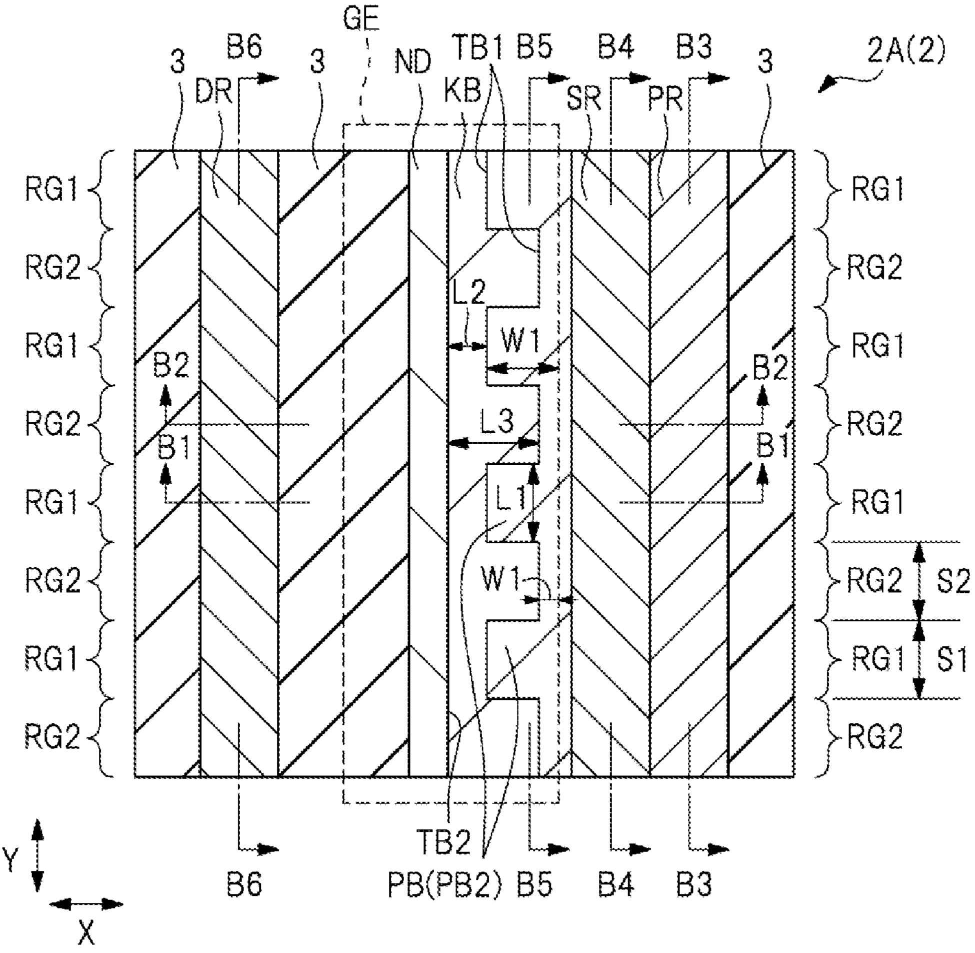
FIG. 7 is a main portion plan view of the semiconductor device of the first embodiment.
Figure 8:
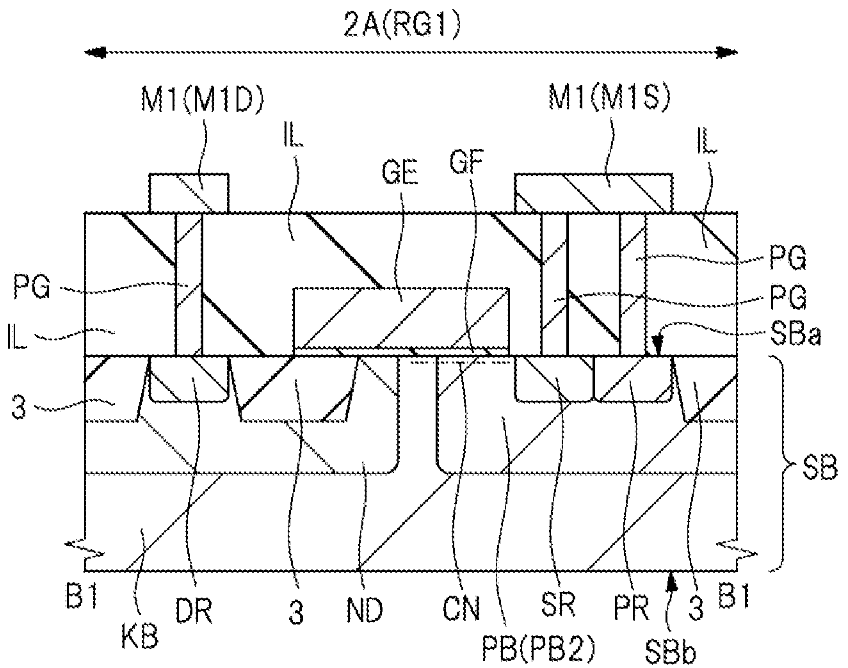
FIG. 8 is a main portion cross-sectional view of the semiconductor device of the first embodiment.
Figure 9:
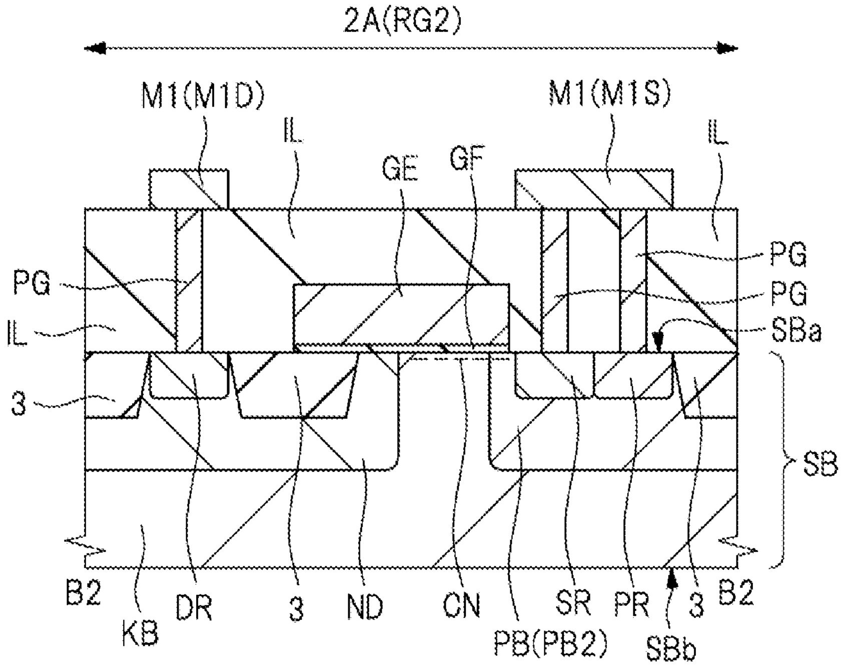
FIG. 9 is a main portion cross-sectional view of the semiconductor device of the first embodiment.

The semiconductor device of the first embodiment will be described referring to the drawings. FIG. 1 and FIG. 7 are main portion plan views of the semiconductor device of the present embodiment, and FIG. 2 to FIG. 6 and FIG. 8 to FIG. 13 are main portion cross-sectional views of the semiconductor device of the present embodiment. FIG. 2, FIG. 8, and FIG. 9 show a cross section substantially orthogonal to the gate width direction (Y direction), and FIG. 3 to FIG. 6 and FIG. 10 to FIG. 13 show a cross section substantially orthogonal to the gate length direction (X direction). The cross-sectional view along A1-A1 line in FIG. 1 substantially corresponds to FIG. 2, the cross-sectional view along A3-A3 line in FIG. 1 substantially corresponds to FIG. 3, the cross-sectional view along A4-A4 line in FIG. 1 substantially corresponds to FIG. 4, the cross-sectional view along A5-A5 line in FIG. 1 substantially corresponds to FIG. 5, and the cross-sectional view along A6-A6 line in FIG. 1 substantially corresponds to FIG. 6. In addition, the cross-sectional view along B1-B1 line in FIG. 7 substantially corresponds to FIG. 8, the cross-sectional view along B2-B2 line in FIG. 7 substantially corresponds to FIG. 9, the cross-sectional view along B3-B3 line in FIG. 7 substantially corresponds to FIG. 10, the cross-sectional view along B4-B4 line in FIG. 7 substantially corresponds to FIG. 11, the cross-sectional view along B5-B5 line in FIG. 7 substantially corresponds to FIG. 12, and the cross-sectional view along B6-B6 line in FIG. 7 substantially corresponds to FIG. 13. FIG. 1 and FIG. 7 show plan view when the upper surface of the semiconductor substrate SB is viewed from above with seeing through the gate dielectric film GF, the gate electrode GE, the interlayer dielectric film IL, the plug PG, the wiring M1, and the structure above the interlayer dielectric film IL. FIG. 1 and FIG. 7 are plan view, and are hatched to facilitate discrimination of the respective regions, and the location of the gate electrode GE is indicated by dotted lines.

Note that the X direction and the Y direction shown in FIG. 1 and FIG. 7 are orthogonal to each other. The X direction and the Y direction are along the upper surface (main surface) SBa or the back surface of the semiconductor substrate SB, that is, the horizontal directions. Here, the X direction corresponds to the gate length direction of the gate electrode GE of the LDMOSFET, and the Y direction corresponds to the gate width direction of the gate electrode GE of the LDMOSFET.

The semiconductor device of the present embodiment includes a MISFET, and includes an LDMOSFET as the MISFET.

In the present application, the MOSFET (Metal Oxide Semiconductor Field Effect Transistor) or the LDMOSFET includes not only a MISFET using an oxide film (silicon oxide film) as a gate dielectric film but also a MISFET using a dielectric film other than the oxide film as a gate dielectric film. The LDMOSFET is a kind of MISFET device. The LDMOSFET may also be referred to as HV-MOSFET (High Voltage Metal Oxide Semiconductor Field Effect Transistor) or DEMOSFET (Drain Extended Metal Oxide Semiconductor Field Effect Transistor). The LDMOSFET is used in a power converting circuit such as an inverter circuit, for example, and can function as a power switching device.

The semiconductor device of the present embodiment includes the element region 1A that is a region (planar region) in which the LDMOSFET 1 is formed, and the element region 2A that is a region (planar region) in which the LDMOSFET 2 is formed. The element region 1A and the element region 2A correspond to planar regions of the semiconductor substrate SB different from each other. Each of the LDMOSFET 1 and the LDMOSFET 2 is formed on the upper surface SBa of the semiconductor substrate SB. Here, the case where the LDMOSFET 1 and the LDMOSFET 2 are n-channel LDMOSFETs will be described.

The threshold voltage of the LDMOSFET 1 formed in the element region 1A and the threshold voltage of the LDMOSFET 2 formed in the element region 2A are different from each other. More specifically, the threshold voltage of the LDMOSFET 2 formed in the element region 2A is lower than the threshold voltage of the LDMOSFET 1 formed in the element region 1A. A plan view of the element region 1A is shown in FIG. 1, cross-sectional views of the element region 1A are shown in FIG. 2 to FIG. 6, a plan view of the element region 2A is shown in FIG. 7, and cross-sectional views of the element region 2A are shown in FIG. 8 to FIG. 13.

The structure of the semiconductor device of the present embodiment will be described below.

The semiconductor substrate SB is made of monocrystalline silicon or the like. As the semiconductor substrate SB, the p-type semiconductor substrate is preferably used, but the n-type semiconductor substrate may also be used. In addition, an epitaxial wafer in which an epitaxial semiconductor layer is formed on the semiconductor substrate may be used as the semiconductor substrate SB. When the epitaxial wafer is used as the semiconductor substrate SB, the p-type substrate region KB is formed by the epitaxial semiconductor layer.

The semiconductor substrate SB has the upper surface SBa and the back surface SBb opposite the upper surface SBa. The STI region (element isolation region) 3 is formed on the upper surface SBa of the semiconductor substrate SB by an STI (Shallow Trench Isolation) method. The STI region 3 is formed of an insulator (insulating film) buried in a trench formed in the semiconductor substrate SB.

Alternatively, instead of the STI regions 3, a LOCOS region can also be formed using a LOCOS (LOCal Oxidation of Silicon) method. In addition, neither STI region 3 nor LOCOS region may be formed.

Structure of Semiconductor Device in Element Region 1A

First, the structure of the semiconductor device in the element region 1A will be specifically described referring to FIG. 1 to FIG. 6.

The semiconductor substrate SB includes the p-type substrate region KB. The p-type substrate region KB is a p-type semiconductor region. The p-type substrate region KB may be a p-type semiconductor region formed in the p-type semiconductor substrate, a p-type semiconductor region formed in the n-type semiconductor substrate, or a region that maintains the p-type in the p-type semiconductor substrate. The p-type substrate region KB may be a p-type epitaxial semiconductor layer formed on the p-type or n-type semiconductor substrate. In the semiconductor substrate SB, an n-type buried layer (not shown) may be present under the p-type substrate region KB.

The element region 1A is included in the p-type substrate region KB in plan view. The plan view corresponds to a view in a plane substantially parallel to the upper surface SBa of the semiconductor substrate SB. Therefore, the n-type source region SR, the n-type drain region DR, and the channel forming region (the region where the channel is formed) of the LDMOSFET 1 formed in the element region 1A are formed in the p-type substrate region KB in plan view.

In the semiconductor substrate SB, the n-type drift region (n-type semiconductor region, n-type well) ND and the p-type body region (p-type semiconductor region, p-type well) PB are formed in an upper portion (upper layer portion) of the p-type substrate region KB. The n-type drift region ND and the p-type body region PB are adjacent to each other or are spaced apart from each other in the gate length direction (X direction) of the LDMOSFET 1. Further, the gate length direction of the LDMOSFET 1 corresponds to the channel length direction of the LDMOSFET 1, and the gate width direction of the LDMOSFET 1 corresponds to the channel width direction of the LDMOSFET 1.

Of the n-type drift region ND and the p-type body region PB, the n-type drift region ND is located on the drain side of the LDMOSFET 1, and the p-type body region PB is located on the source side of the LDMOSFET 1. The n-type drift region ND and the p-type body region PB reach the upper surface SBa of the semiconductor substrate SB. A bottom surface of each of the n-type drift region ND and the p-type body region PB is in contact with the p-type substrate region KB. In other words, the bottom surface of each of the n-type drift region ND and the p-type body region PB is covered with the p-type substrate region KB. A PN junction is formed at a boundary between the n-type drift region ND and the p-type substrate region KB. An impurity concentration (p-type impurity concentration) of the p-type body region PB is higher than an impurity concentration (p-type impurity concentration) of the p-type substrate region KB.

The p-type body region PB is formed so as to surround the n-type source region SR and the p-type body contact region PR, which will be described later. The p-type body region PB can function as a back gate. The p-type body region PB can also function as a punch-through stopper that suppresses the extension of the depletion layer from the drain to the source of the LDMOSFET 1.

In the semiconductor substrate SB, the n-type source region SR and the p-type body contact region (p-type semiconductor region) PR are formed in the p-type body region PB. The n-type source region SR functions as a source region of the LDMOSFET 1. Between the n-type source region SR and the n-type drain region DR, a part of the p-type body region PB is located under the gate electrode GE. Between the n-type source region SR and the n-type drain region DR, an upper portion (upper layer portion) of the p-type body region PB located under the gate electrode GE and an upper portion (upper layer portion) of the p-type substrate region KB located under the gate electrode GE are the channel forming regions of the LDMOSFET 1.

Each of the n-type source region SR and the p-type body contact region PR extends in the gate width direction (Y direction) of the LDMOSFET 1, and the n-type source region SR and the p-type body contact region PR are adjacent to each other in the gate length direction (X direction) of the LDMOSFET 1. Among the n-type source region SR and the p-type body contact region PR, the n-type source region SR is located on a side adjacent to the channel forming region of the LDMOSFET 1, and the p-type body contact region PR is located on a side far from the channel forming region of the LDMOSFET 1. That is, the n-type source region SR is located between the channel forming region and the p-type body contact region PR. The bottom surface of the n-type source region SR and the bottom surface of the p-type body contact region PR are in contact with the p-type body region PB. That is, the bottom surface of the n-type source region SR and the bottom surface of the p-type body contact region PR are covered with the p-type body region PB. In addition, a side surface of the n-type source region SR, which is opposite the side adjacent to the p-type body contact region PR, is in contact with the p-type body region PB. That is, the side surface of the n-type source region SR that is opposite the side adjacent to the p-type body contact region PR is covered with the p-type body region PB. Therefore, the p-type body region PB extends in the Y direction while covering the bottom surface of the n-type source region SR and the bottom surface of the p-type body contact region PR and the side surface of the n-type source region SR (the side surface opposite the side adjacent to the p-type body contact region PR). An upper surface of the n-type source region SR and an upper surface of the p-type body contact region PR reach the upper surface SBa of the semiconductor substrate SB. In addition, an LDD (Lightly Doped Drain) structure can be applied to the n-type source region SR.

An impurity concentration of the p-type body contact region PR is higher than an impurity concentration of the p-type body region PB. The p-type body contact region PR can function as a contact portion of the p-type body region PB.

The n-type drain region (n-type semiconductor region) DR is formed in the n-type drift region ND. The n-type drain region DR functions as a drain region of the LDMOSFET 1. The n-type drain region DR extends in the Y direction, and an upper surface of the n-type drain region DR reaches the upper surface SBa of the semiconductor substrate SB. An impurity concentration of the n-type drain region DR is higher than an impurity concentration of the n-type drift region ND. The n-type drain region DR and the n-type source region SR are spaced apart from each other in the X direction.

The gate electrode GE of the LDMOSFET 1 is formed on the upper surface SBa of the semiconductor substrate SB via the gate dielectric film GF. Specifically, the gate electrode GE is formed on the upper surface SBa of the semiconductor substrate SB between the n-type source region SR and the n-type drain region DR via the gate dielectric film GF. The gate dielectric film GF is formed of, for example, a silicon oxide film. The gate electrode GE is formed of, for example, a single layer film of a polycrystalline silicon film (doped polysilicon film) or a stacked film of a polycrystalline silicon film and a metal silicide layer.

In plan view, between the channel forming region of the LDMOSFET 1 and the n-type drain region DR, the STI region 3 is disposed, and a part (a part of the drain side) of the gate electrode GE is disposed on the STI region 3. That is, a part of the gate electrode GE is located on the STI region 3. The STI region 3 interposed between the channel forming region of the LDMOSFET 1 and the n-type drain region DR extends in the Y direction, and the n-type drift region ND is present under the STI region 3 interposed between the channel forming region and the n-type drain region DR. The bottom surface of the n-type drain region DR is in contact with the n-type drift region ND, and the side surface of the n-type drain region DR is in contact with the STI region 3. In other words, the bottom surface of the n-type drain region DR is covered with the n-type drift region ND, and the side surface of the n-type drain region DR is covered with the STI region 3. Therefore, the n-type drift region ND under the STI region 3 can also function as a conduction path between the channel of the LDMOSFET 1 and the n-type drain region DR.

Note that, in FIG. 2, the case where the gate dielectric film GF is interposed between the gate electrode GE and the STI region 3 under the gate electrode GE is shown, but there may be the case where the gate dielectric film GF is not interposed between the gate electrode GE and the STI region 3 under the gate electrode GE. Sidewall spacers (not shown) formed of an insulating film (for example, a silicon oxide film) may be formed on both side surfaces of the gate electrode GE.

The p-type body region PB and the n-type drift region ND extend in the Y direction, and a part of the p-type body region PB is located under the gate electrode GE, and a part of the n-type drift region ND is located under the gate electrode GE. From another viewpoint, a part of the gate electrode GE (a part on the source side) overlaps with the p-type body region PB in plan view, and another part of the gate electrode GE (a part on the drain side) overlaps with the n-type drift region ND in plan view. A part of the p-type body region PB located under the gate electrode GE (that is, a part overlapping with the gate electrode GE in plan view) extends in the Y direction with a constant width (width in the X direction). In addition, a part of the n-type drift region ND located under the gate electrode GE (that is, a part overlapping with the gate electrode GE in plan view) extends in the Y direction with a constant width (width in the X direction).

In FIG. 2, the p-type substrate region KB is interposed between the p-type body region PB and the n-type drift region ND in the X direction. In this case, the side surface of the n-type drift region ND (the side surface facing the p-type body region PB) forms a PN junction in contact with the p-type substrate region KB, and the side surface of the p-type body region PB (the side surface facing the n-type drift region ND) is also in contact with the p-type substrate region KB.

In another embodiment, the p-type body region PB and the n-type drift region ND may be in contact with each other in the X direction, and a PN junction is formed at a boundary between the p-type body region PB and the n-type drift region ND.

The side surface of the n-type drift region ND (the side surface facing the p-type body region PB) is located in the middle of the gate electrode GE in the X direction and extends in the Y direction.

In plan view, the gate electrode GE is disposed between the n-type source region SR and the n-type drain region DR. When a voltage equal to or higher than the threshold voltage is applied to the gate electrode GE, an n-type inversion layer is formed in an upper portion (upper layer portion) of the p-type body region PB in a portion located under the gate electrode GE and in an upper portion (upper layer portion) of the p-type substrate region KB in a portion located under the gate electrode GE. The n-type inversion layer functions as a channel (channel region). The n-type source region SR and the n-type drain region DR conduct via the channel and the n-type drift region ND.

In the X direction, the n-type drift region ND having an impurity concentration (n-type impurity concentration) lower than an impurity concentration of the n-type drain region DR is interposed between the p-type body region PB and the n-type drain region DR. Therefore, the n-type drift region ND having an impurity concentration lower than an impurity concentration of the n-type drain region DR is present between the channel forming region of the LDMOSFET 1 and the n-type drain region DR. Therefore, in the X direction, the channel forming region and the n-type drift region ND are present between the n-type source region SR and the n-type drain region DR, the channel forming region is located on the n-type source region SR side, and the n-type drift region ND is located on the n-type drain region DR side. In addition, the p-type substrate regions KB under the n-type drift region ND and the p-type body region PB can function as a resurf layer (resurf region).

In addition, a metal silicide layer (not shown) may be formed on the upper portion (surface layer portion) of each of the n-type drain region DR, the n-type source region SR, and the p-type body contact region PR. The metal silicide layers can be formed using a Salicide (Self Aligned Silicide) technique.

In the present embodiment, the n-type drain region DR is in contact with the n-type drift region ND. Accordingly, the n-type drain region DR and the n-type drift region ND are electrically connected to each other. In another embodiment, the n-type drain region DR may not be in contact with the n-type drift region ND, and the n-type semiconductor region having an impurity concentration higher than an impurity concentration of the n-type drift region ND and lower than an impurity concentration of the n-type drain region DR may be interposed between the n-type drain region DR and the n-type drift region ND. In this case, the n-type drain region DR and the n-type drift region ND are electrically connected to each other via the n-type semiconductor region interposed therebetween. In any case, the n-type drain region DR and the n-type drift region ND are electrically connected to each other.

Structure of Semiconductor Device in Element Region 2A

Next, the structure of the semiconductor device in the element region 2A will be specifically described referring to FIG. 7 to FIG. 13. In the following description, the structure of the semiconductor device in the element region 2A will be mainly described with respect to the difference in the structure of the semiconductor device in the element region 1A, and the structure of the semiconductor device in the element region 2A in common with the structure of semiconductor device in the element region 1A will not be described repeatedly.

Figure 10:
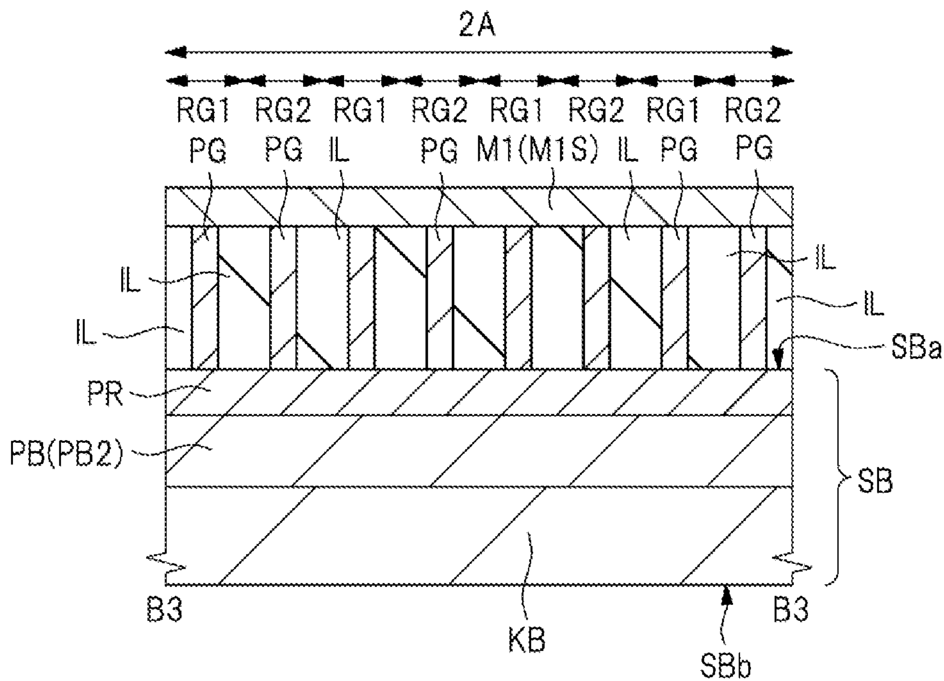
FIG. 10 is a main portion cross-sectional view of the semiconductor device of the first embodiment.
Figure 11:
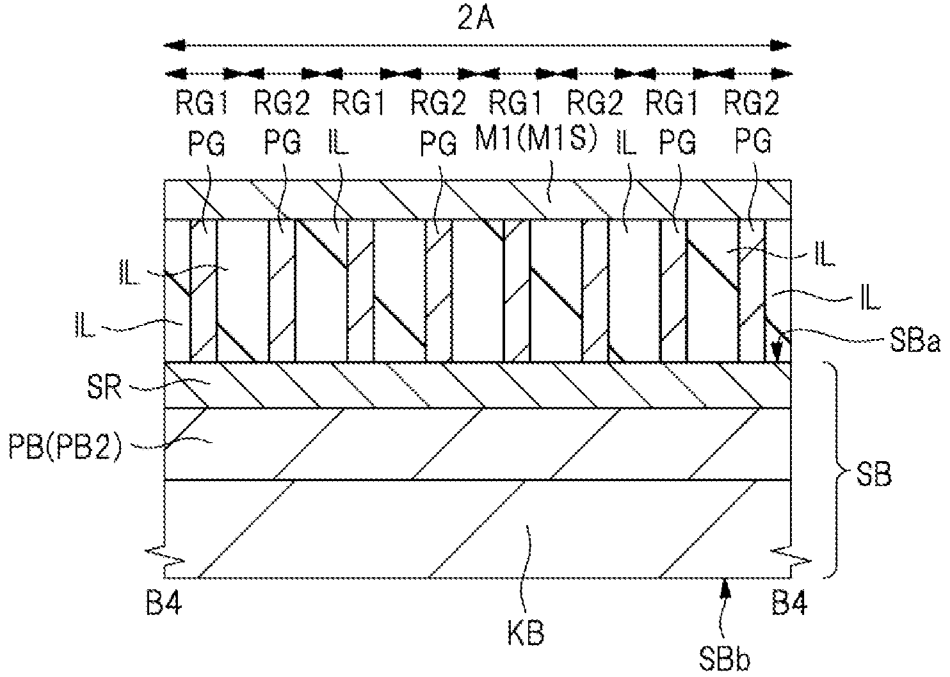
FIG. 11 is a main portion cross-sectional view of the semiconductor device of the first embodiment.
Figure 12:
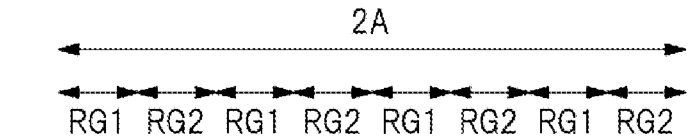
FIG. 12 is a main portion cross-sectional view of the semiconductor device of the first embodiment.
Figure 12:
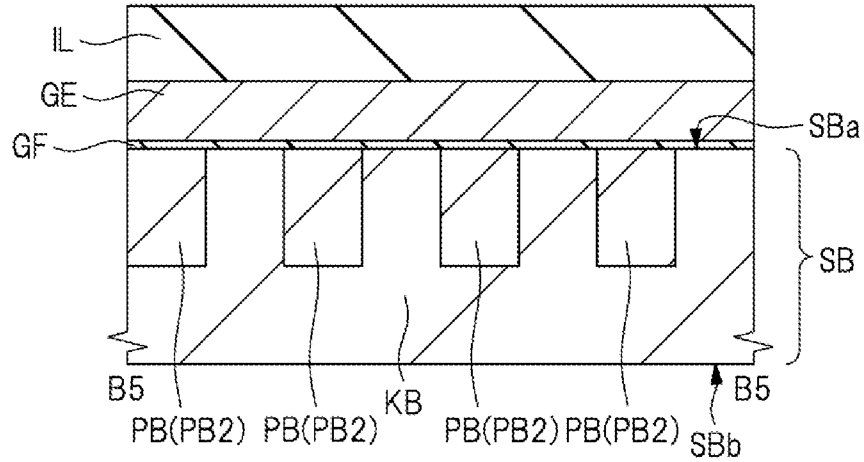
Figure 13:
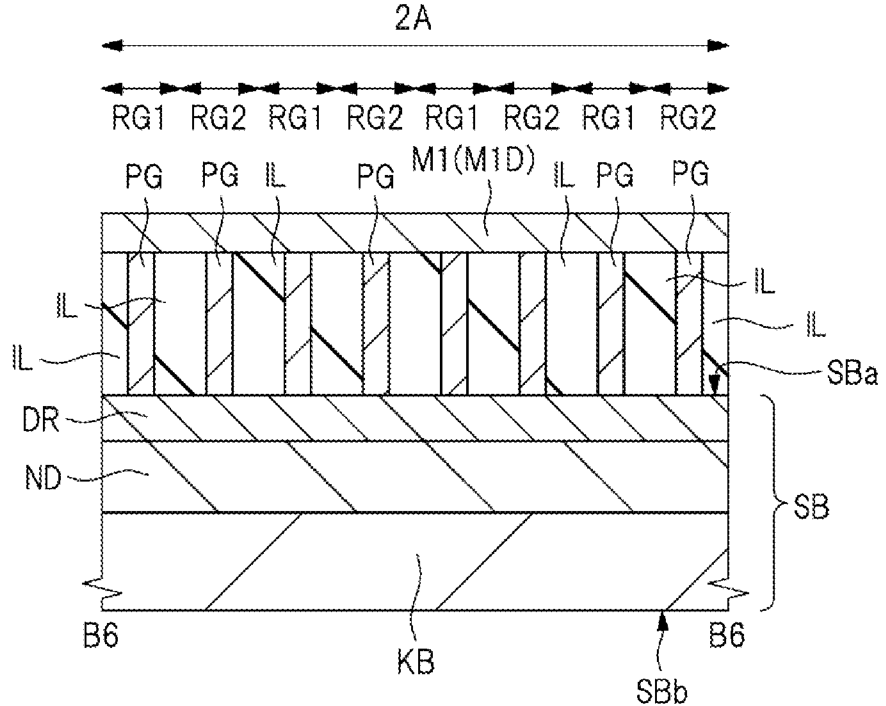
FIG. 13 is a main portion cross-sectional view of the semiconductor device of the first embodiment.

The formation region of the p-type body region PB in the structure of the semiconductor device in the element region 2A is different from the structure of the semiconductor device in the element region 1A, and the structure of the semiconductor device in the element region 2A except for the formation region of the p-type body region PB is basically the same as the structure of the semiconductor device in the element region 1A. Thus, the cross-sectional structure of FIG. 10 is substantially the same as the cross-sectional structure of FIG. 3, the cross-sectional structure of FIG. 11 is substantially the same as the cross-sectional structure of FIG. 4, and the cross-sectional structure of FIG. 13 is substantially the same as the cross-sectional structure of FIG. 6. Hereinafter, the p-type body region PB formed in the semiconductor substrate SB in the element region 2A is referred to as the p-type body region PB2, and the p-type body region PB formed in the semiconductor substrate SB in the element region 1A is referred to as the p-type body region PB1. Further, although the LDMOSFET formed in the element region 1A is referred to as the LDMOSFET 1, the LDMOSFET formed in the element region 2A is referred to as the LDMOSFET 2.

In the element region 2A, the region RG1 having the cross-sectional structure shown in FIG. 8 and the region RG2 having the cross-sectional structure shown in FIG. 9 are alternately repeated in the gate width direction (Y direction) of the LDMOSFET 2. That is, in the element region 2A, in the Y direction, the region RG2 having the cross-sectional structure shown in FIG. 9 is present adjacent to the region RG1 having the cross-sectional structure shown in FIG. 8, and the region RG1 having the cross-sectional structure shown in FIG. 8 is present adjacent to the region RG2 having the cross-sectional structure shown in FIG. 9. FIG. 8 is a cross-sectional view of the region RG1 (cross-sectional view orthogonal to the Y direction), and FIG. 9 is a cross-sectional view of the region RG2 (cross-sectional view orthogonal to the Y direction).

The cross-sectional structure shown in FIG. 8 is substantially the same as the cross-sectional structure shown in FIG. 2. On the other hand, in the cross-sectional structure shown in FIG. 9, the formation region of the p-type body region PB2 is different from the cross-sectional structure shown in FIG. 8.

What is common for the formation region of the p-type body region PB2 between the cross-sectional structure of FIG. 8 and the cross-sectional structure of FIG. 9 is that the p-type body region PB2 is present under the n-type source region SR and the p-type body contact region PR, and that the bottom surface of the n-type source region SR and the bottom surface of the p-type body contact region PR are in contact with (and therefore are covered with) the p-type body region PB2. Therefore, in the element region 2A in which the region RG1 having the cross-sectional structure shown in FIG. 8 and the region RG2 having the cross-sectional structure shown in FIG. 9 are repeated in the Y direction, the p-type body region PB2 extends in the Y direction while covering the bottom surface of the n-type source region SR and the bottom surface of the p-type body contact region PR (see FIG. 8 to FIG. 11).

However, in the region RG1 having the cross-sectional structure shown in FIG. 8 and the region RG2 having the cross-sectional structure shown in FIG. 9, the widths W1 of the p-type body regions PB overlapping with the gate electrode GE are different from each other. Here, in plan view, the width of the p-type body region PB overlapping with the gate electrode GE (that is, the width of the part of the p-type body region PB located under the gate electrode GE) is referred to as the width W1 of the p-type body region PB overlapping with—the gate electrode GE. The width W1 of the p-type body region PB overlapping with the gate electrode GE corresponds to the width (dimension) in the X direction. The width W1 is shown in FIG. 1 and FIG. 7.

In the present embodiment, as can be seen from FIG. 7, the width W1 of the p-type body region PB (PB2) overlapping with the gate electrode GE in the region RG2 is smaller than the width W1 of the p-type body region PB (PB2) overlapping with the gate electrode GE in the region RG1.

In the element region 1A, the width W1 of the p-type body region PB(PB1) overlapping with the gate electrode GE is substantially constant regardless of the location in the Y direction. That is, in the element region 1A, when the cross section orthogonal to the Y direction is viewed, the width W1 is substantially the same (constant) in the cross section at any location in the Y direction. Therefore, in the element region 1A, the p-type body region PB1 extends in the Y direction so as to cover the bottom surface of the n-type source region SR and the bottom surface of the p-type body contact region PR, and while overlapping with the gate electrode GE in plan view with a constant width W1.

Further, in the element region 2A, in the region RG1 having the cross-sectional structure of FIG. 8, the width W1 of the p-type body region PB (PB2) overlapping with the gate electrode GE is substantially constant regardless of the location in the Y direction, and is substantially the same as the width W1 of the p-type body region PB1 overlapping with the gate electrode GE in the element region 1A. That is, in the region RG1 of the element region 1A, when the cross section orthogonal to the Y direction is viewed, the width W1 is substantially the same (constant) in the cross section at any location in the Y direction. On the other hand, in the element region 2A, in the region RG2 having the cross-sectional structure of FIG. 9, the width W1 of the p-type body region PB (PB2) overlapping with the gate electrode GE is smaller than the width W1 of the p-type body region PB (PB2) overlapping with the gate electrode GE in the region RG1 having the cross-sectional structure of FIG. 8. In other words, as compared with the region RG1 of the element region 2A, in the region RG2 of the element region 2A, the end portion (the end portion opposite the n-type drift region ND) TB1 of the p-type body region PB2 is retracted in the X direction so that the width W1 of the p-type body region PB2 overlapping with the gate electrode GE is reduced in plan view. In yet another view, in the X direction, the smallest distance (nearest distance) L3 between the p-type body region PB2 and the n-type drift region ND in the region RG2 is greater than the smallest distance (nearest distance) L2 between the p-type body region PB2 and the n-type drift region ND in the region RG1 (i.e., L3>L2).

The width W1 of the p-type body region PB2 overlapping with the gate electrode GE in the region RG2 may be zero (W1=0). In the region RG2, that the width W1 of the p-type body region PB2 overlapping with the gate electrode GE is zero (W1=0) means that the p-type body region PB2 do not overlap with the gate electrode GE in plan view. From another viewpoint, that the width W1 in the region RG2 is zero (W1=0) means that the p-type body region PB2 is not located under the gate electrode GE in the region RG2.

Figure 14:
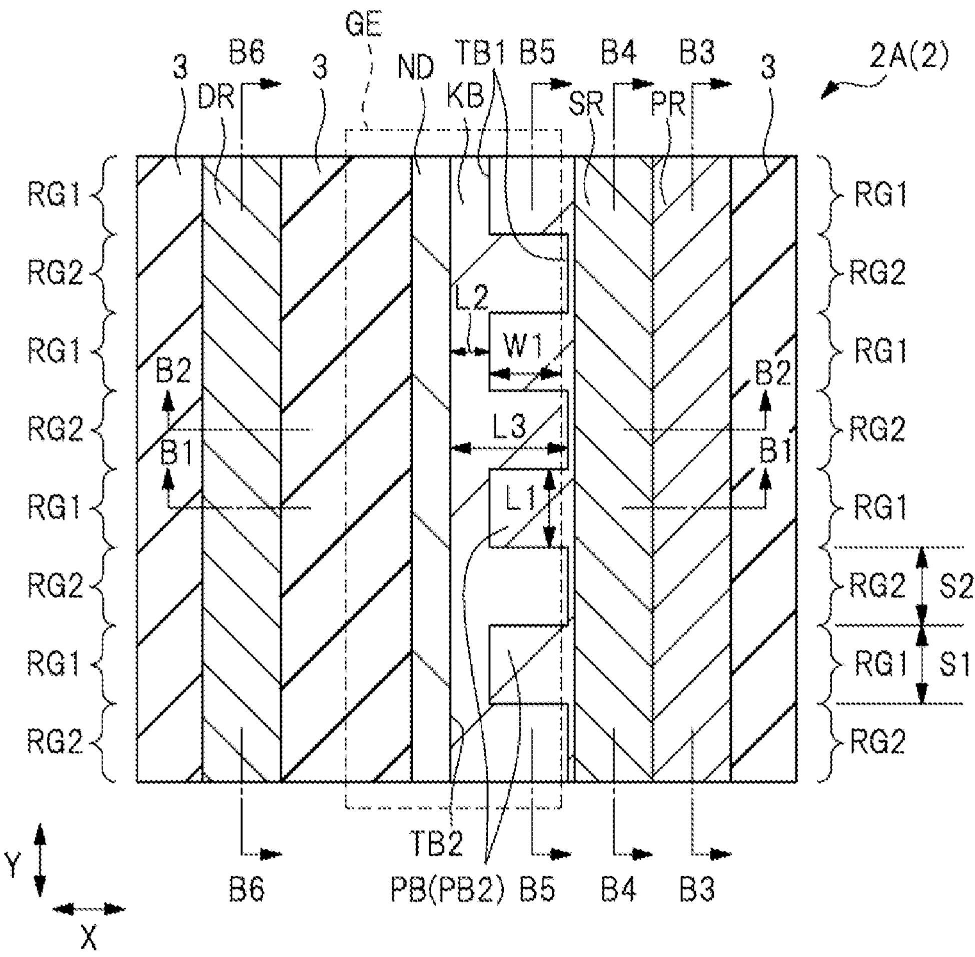
FIG. 14 is a main portion plan view of the semiconductor device of the first embodiment.
Figure 15:
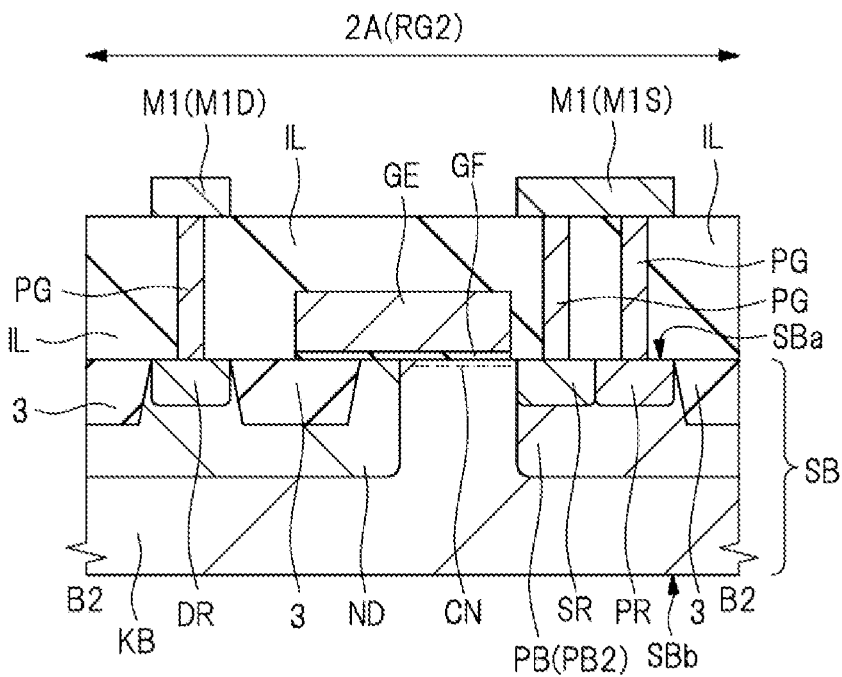
FIG. 15 is a main portion cross-sectional view of the semiconductor device of the first embodiment.

FIG. 14 and FIG. 15 are a plan view (FIG. 14) and a cross-sectional view (FIG. 15) of the element region 2A when the width W1 of the p-type body region PB2 overlapping with the gate electrode GE in the region RG2 is zero (W1=0). On the other hand, FIG. 7 and FIG. 9 are a plan view (FIG. 7) and a cross-sectional view (FIG. 9) of the element region 2A when the width W1 of the p-type body region PB2 overlapping with the gate electrode GE in the region RG2 is greater than zero (W1>0).

FIG. 14 corresponds to FIG. 7, and FIG. 15 is a cross-sectional view along B2-B2 line in FIG. 14. The cross-sectional view along B1-B1 line in FIG. 14 is similar to that in FIG. 8, the cross-sectional view along B3-B3 line in FIG. 14 is similar to that in FIG. 10, the cross-sectional view along B4-B4 line in FIG. 14 is similar to that in FIG. 11, the cross-sectional view along B5-B5 line in FIG. 14 is similar to that in FIG. 12, and the cross-sectional view along B6-B6 line in FIG. 14 is similar to that in FIG. 13.

In FIG. 14, a part of the p-type body region PB2 overlaps with the gate electrode GE in the region RG1 in plan view, but the p-type body region PB2 does not overlap with the gate electrode GE in the region RG2 in plan view. In this case, as shown in FIG. 8, a part of the p-type body region PB2 is located under the gate electrode GE in the region RG1, whereas, as shown in FIG. 15, the p-type body region PB2 is not formed (located) under the gate electrode GE in the region RG2. In another view, in FIG. 14, the end portion (the end portion opposite the n-type drift region ND) TB1 of the p-type body region PB2 overlaps with the gate electrode GE in plan view in the region RG1 of the element region 2A, but the end portion (the end portion opposite the n-type drift region ND) TB1 of the p-type body region PB2 does not overlap with the gate electrode GE and is therefore exposed from the gate electrode GE in plan view in the region RG2 of the element region 2A. That is, in FIG. 14, the end portion TB1 of the p-type body region PB2 closest to the n-type drift region ND in the region RG2 is exposed from the gate electrode GE in the X direction.

Comparing FIG. 8 and FIG. 9 (or FIG. 15), the p-type substrate region KB is present in FIG. 9 (or FIG. 15) in the portion where the p-type body region PB2 is formed in FIG. 8 while the p-type body region PB2 is not formed in FIG. 9 (or FIG. 15).

Therefore, in the cross-sectional structure shown in FIG. 8 (and thus the region RG1) and the cross-sectional structure shown in FIG. 9 (and thus the region RG2), the surface layer portion of the semiconductor substrate SB under the gate electrode GE is configured by the n-type drift region ND, the p-type substrate region KB, and the p-type body region PB. Therefore, in the cross-sectional structure (region RG1) shown in FIG. 8 and the cross-sectional structure (region RG2) shown in FIG. 9, the upper portion (upper layer portion) of the p-type body region PB located under the gate electrode GE and the upper portion (upper layer portion) of the p-type substrate region KB located under the gate electrode GE function as the channel forming region CN of the LDMOSFET 2. That is, in the cross-sectional structure (region RG1) shown in FIG. 8 and the cross-sectional structure (region RG2) shown in FIG. 9, the channel forming region CN of the LDMOSFET 2 is configured by the p-type body region PB and the p-type substrate region KB. In FIG. 8, FIG. 9, and FIG. 15, the location of the channel forming region CN is schematically indicated by dotted lines.

However, as described above, the width W1 in the region RG2 is smaller than the width W1 in the region RG1. Reflecting this, the ratio of the p-type body region PB to the channel forming region CN in the cross-sectional structure (and thus the region RG2) shown in FIG. 9 is smaller than the ratio of the p-type body region PB to the channel forming region CN in the cross-sectional structure (and thus the region RG1) shown in FIG. 8.

On the other hand, in the cross-sectional structure (thus, region RG2) shown in FIG. 15, the surface layer portion of the semiconductor substrate SB under the gate electrode GE is configured by the n-type drift region ND and the p-type substrate region KB, and the upper portion (upper layer portion) of the p-type substrate region KB located under the gate electrode GE functions as the channel forming region CN of the LDMOSFET 2. That is, in the cross-sectional structure shown in FIG. 9 (and thus in the region RG2), the channel forming region CN of the LDMOSFET 2 is configured by the p-type substrate region KB, and the p-type body region PB does not function as the channel forming region.

Therefore, in the cross-sectional structure shown in FIG. 8 (and thus the region RG1) and the cross-sectional structure shown in FIG. 9 (and thus the region RG2), when a voltage equal to or higher than the threshold voltage is applied to the gate electrode GE, the n-type inversion layer (channel) is formed in the upper portion (upper layer portion) of the p-type body region PB located under the gate electrode GE and the upper portion (upper layer portion) of the p-type substrate region KB located under the gate electrode GE. On the other hand, in the cross-sectional structure shown in FIG. 15 (thus, the region RG2), when a voltage equal to or higher than the threshold voltage is applied to the gate electrode GE, the n-type inversion layer (channel) is formed in the upper portion (upper layer portion) of the p-type substrate region KB located under the gate electrode GE. The n-type source region SR and the n-type drain region DR conduct via the n-type inversion layer (channel) and the n-type drift region ND.

In FIG. 7 and FIG. 14, as an example, four regions RG1 and four regions RG2 are alternately disposed in the Y direction, but the numbers of regions RG1 and RG2 can be changed as needed. For example, when the gate width of the LDMOSFET is large, the dimension of the element region 2A in the Y direction is large, and thus the numbers of the region RG1 and the region RG2 increase. In any case, in the element region 2A, there are a plurality of regions RG1 and RG2, and the regions RG1 and RG2 are arranged so as to be adjacent to each other in the Y direction.

Structure Above Semiconductor Substrate

Next, the structure above the semiconductor substrate SB will be described.

As shown in FIG. 2 to FIG. 6, FIG. 8 to FIG. 13, and FIG. 15, the interlayer dielectric film IL is formed on the upper surface of the semiconductor substrate SB so as to cover the gate electrode GE. The interlayer dielectric film IL is formed of, for example, a silicon oxide film. The interlayer dielectric film IL can also be formed by a stacked film of a relatively thin silicon nitride film and a relatively thick silicon oxide film on the silicon nitride. An upper surface of the interlayer dielectric film IL is planarized.

A contact hole (through-hole) is formed in the interlayer dielectric film IL, and a conductive plug (contact plug) PG including a tungsten (W) film as a main component is formed (buried) in the contact hole. A plurality of plugs PG are provided, and each of the plurality of plugs PG penetrates through the interlayer dielectric film IL. The plug PG is formed on each of the n-type source region SR, the n-type drain region DR, and the p-type body contact region PR.

The plug PG may also be disposed on the gate electrode GE, but the plug PG on the gate electrode GE is not shown in the cross-sectional views of FIG. 2 to FIG. 6, FIG. 8 to FIG. 13 and FIG. 15.

By being in contact with the n-type drain region DR, the plug PG disposed on the n-type drain region DR is electrically connected to the n-type drain region DR1. By being in contact with the n-type source region SR, the plug PG disposed on the n-type source region SR is electrically connected to the n-type source region SR1. By being in contact with the p-type body contact region PR, the plug PG disposed on the p-type body contact region PR is electrically connected to the p-type body contact region PR, and is further electrically connected to the p-type body region PB via the p-type body contact region PR.

When a metal silicide layer (not shown) is formed on each upper portion (surface layer portion) of the n-type drain region DR, the n-type source region SR, and the p-type body contact region PR, each plug PG is in contact with the metal silicide layer, and is electrically connected to each region under the metal silicide layer via the metal silicide layer.

The wirings (first layer wirings) M1 made of a conductive film mainly formed of aluminum (Al), aluminum alloy, or the like are formed on the interlayer dielectric film IL in which the plug PG is buried. The wirings M1 are preferably aluminum wirings, but may also be wirings using other metal materials, for example, tungsten wirings or copper wirings. Each of the plugs PG is electrically connected to the wiring M1.

The wiring M1 includes the source wiring MIS electrically connected to the n-type source region SR via the plug PG disposed on the n-type source region SR, and the drain wiring MID electrically connected to the n-type drain region DR via the plug PG disposed on the n-type drain region DR.

In the element region 1A, the source wiring MIS is electrically connected to the n-type source region SR via the plug PG disposed on the n-type source region SR, and is electrically connected to the p-type body contact region PR via the plug PG disposed on the p-type body contact region PR. That is, in the element region 1A, the source wiring MIS is electrically connected to both the plug PG disposed on the n-type source region SR and the plug PG disposed on the p-type body contact region PR. Therefore, in the element region 1A, the potential supplied from the plug PG disposed on the n-type source region SR to the n-type source region SR and the potential supplied from the plug PG disposed on the p-type body contact region PR to the p-type body contact region PR are the same as each other. Therefore, in the element region 1A, the potential (source potential), that is the same as the potential (source potential) supplied from the source wiring MIS to the n-type source region SR via the plug PG disposed on the n-type source region SR, is supplied from the source wiring MIS to the p-type body contact region PR via the plug PG disposed on the p-type body contact region PR, and supplied from the p-type body contact region PR to the p-type body region PB.

In the element region 2A, the source wiring MIS is electrically connected to the n-type source region SR via the plug PG disposed on the n-type source region SR, and is electrically connected to the p-type body contact region PR via the plug PG disposed on the p-type body contact region PR. That is, in the element region 2A, the source wiring MIS is electrically connected to both the plug PG disposed on the n-type source region SR and the plug PG disposed on the p-type body contact region PR. Therefore, in the element region 2A, the potential supplied from the plug PG disposed on the n-type source region SR to the n-type source region SR and the potential supplied from the plug PG disposed on the p-type body contact region PR to the p-type body contact region PR are the same as each other. Therefore, in the element region 2A, the potential (source potential), that is the same as the potential (source potential) supplied from the source wiring MIS to the n-type source region SR via the plug PG disposed on the n-type source region SR, is supplied from the source wiring MIS to the p-type body contact region PR via the plug PG disposed on the p-type body contact region PR, and supplied from the p-type body contact region PR to the p-type body region PB.

The wiring M1 further includes a gate wiring electrically connected to the gate electrode GE via the plug PG, but the gate wiring is not shown in the cross-sectional views of FIG. 2 to FIG. 6, FIG. 8 to FIG. 13, and FIG. 15.

The interlayer dielectric film IL and a structure above the wiring M1 are not shown and described here.

In addition, the LDMOSFET 1 formed in the element region 1A may have a configuration in which a plurality of unit LDMOSFETs are connected in parallel, and similarly, the LDMOSFET 2 formed in the element region 2A may have a configuration in which a plurality of unit LDMOSFETs are connected in parallel. As described above, when a voltage equal to or higher than the threshold voltage is applied to the gate electrode GE, a channel (n-type inversion layer) is formed. When the channel is formed, the n-type source region SR and the n-type drain region DR conduct through the channel (n-type inversion layer) and the n-type drift region ND. In this state, if a large current flows between the n-type source region SR and the n-type drain region DR, the n-type source region SR may be at a higher potential than the p-type body region PB, and the parasitic bipolar transistor may operate (be turned on). However, it is possible to suppress the n-type source region SR from becoming a higher potential than the p-type body region PG when a large current flows between the n-type source region SR and the n-type drain region DR by supplying the same potential as the potential supplied from the plug PG disposed on the n-type source region SR to the n-type source region SR from the plug PG disposed on the p-type body contact region PR to the p-type body region PB via the p-type body contact region PR. This can prevent the parasitic bipolar transistor from operating. The maximum voltage applied between the n-type source region SR and the n-type drain region DR that does not operate the parasitic bipolar transistor is the on-state breakdown voltage. By forming the p-type body contact region PR and supplying the same potential as the potential supplied to the source region SR to the p-type body region PB via the p-type body contact region PR, the on-state breakdown voltage of the LDMOSFET can be increased.

Manufacturing Step of Semiconductor Device

Figure 16:
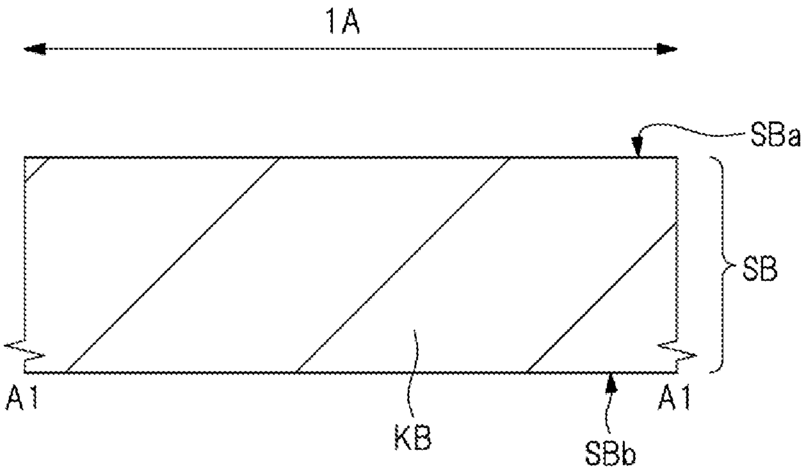
FIG. 16 is a main portion cross-sectional view in a manufacturing step of the semiconductor device of the first embodiment.
Figure 17:
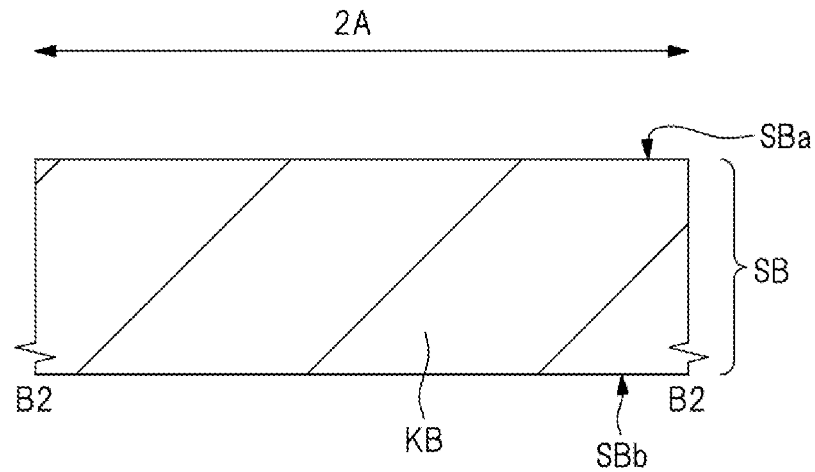
FIG. 17 is a main portion cross-sectional view in the same manufacturing step of the semiconductor device as in FIG. 16.
Figure 18:
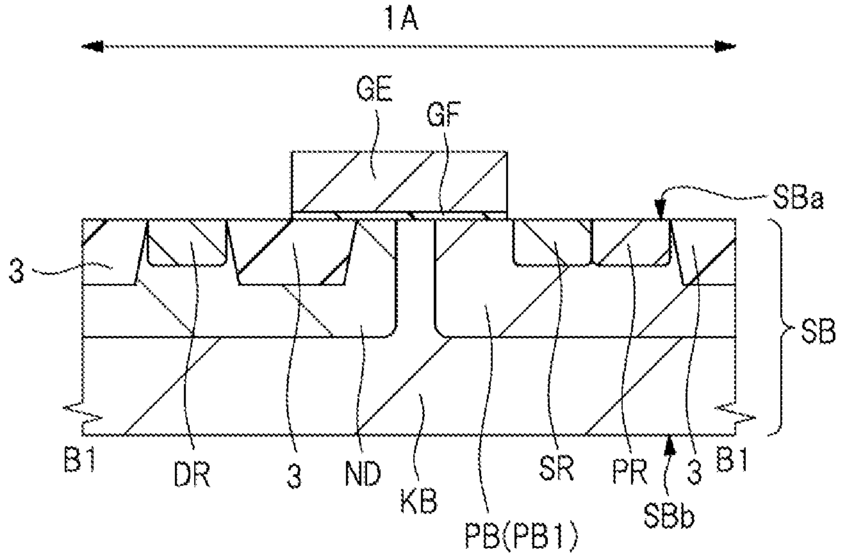
FIG. 18 is a main portion cross-sectional view in the manufacturing step of the semiconductor device following FIG. 17.
Figure 19:
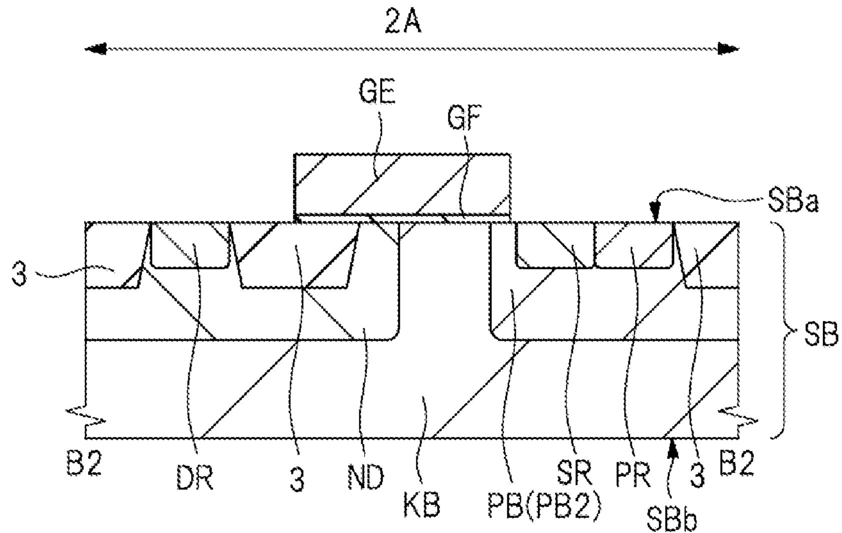
FIG. 19 is a main portion cross-sectional view in the same manufacturing step of the semiconductor device as in FIG. 18.
Figure 20:
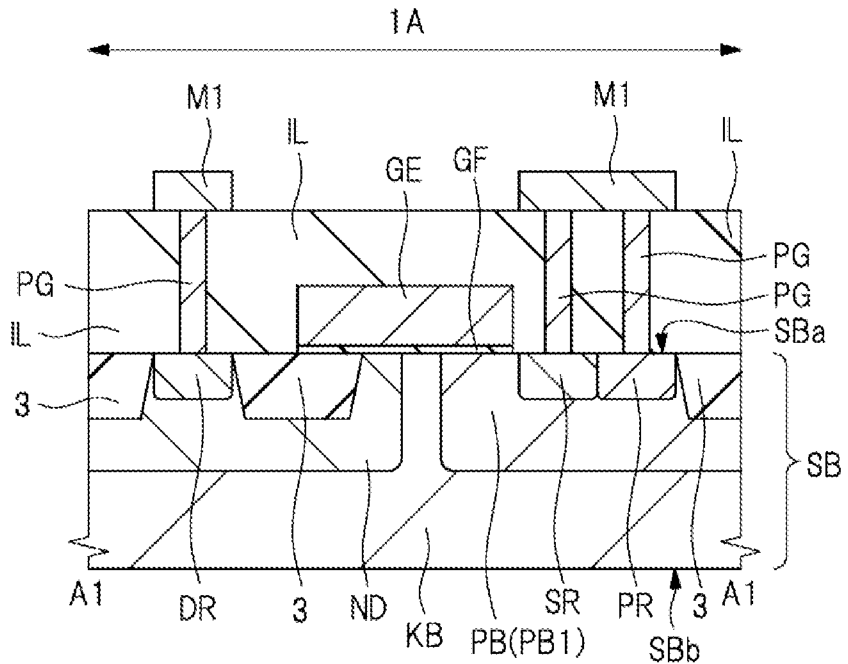
FIG. 20 is a main portion cross-sectional view in the manufacturing step of the semiconductor device following FIG. 19.
Figure 21:
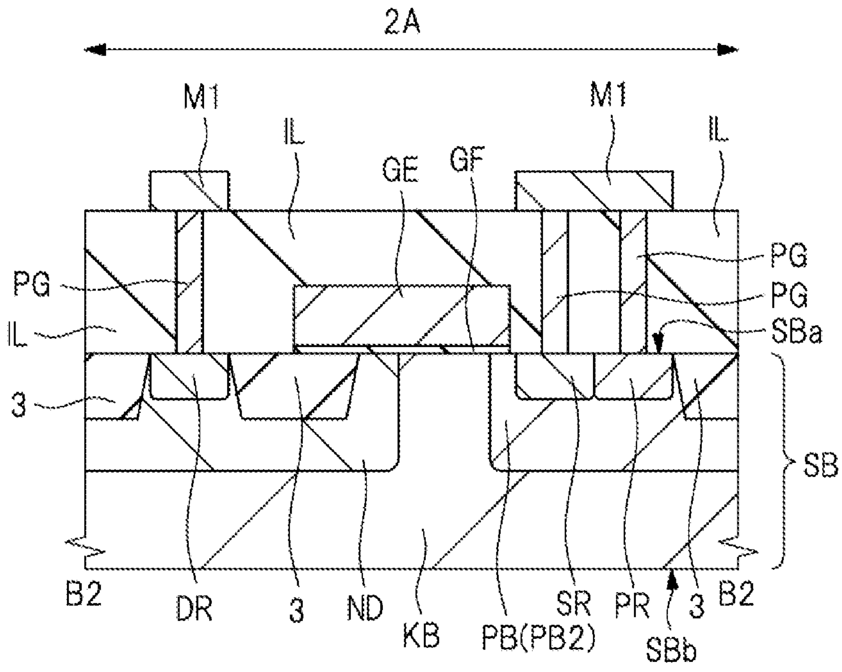
FIG. 21 is a main portion cross-sectional view in the same manufacturing step of the semiconductor device as in FIG. 20.

Next, the manufacturing step of the semiconductor device of the present embodiment will be described referring to FIG. 16 to FIG. 21. FIG. 16 to FIG. 21 are main portion cross-sectional views of the semiconductor device in the manufacturing steps according to the present embodiment. FIG. 16, FIG. 18, and FIG. 20 are cross-sectional views of the element region 1A, and show cross sections corresponding to FIG. 2. FIG. 17, FIG. 19, and FIG. 21 are cross-sectional views of the element region 2A, and show cross sections corresponding to FIG. 9.

As shown in FIG. 16 and FIG. 17, first, the semiconductor substrate SB is prepared. The semiconductor substrate SB may be, for example, a p-type monocrystalline silicon substrate, or an epitaxial wafer in which a p-type epitaxial semiconductor layer is formed on the p-type monocrystalline silicon substrate, and may further include the n-type buried layer. In any case, the semiconductor substrate SB includes the p-type substrate region KB. At this stage, since the p-type body region PB, the n-type source region SR, the p-type body contact region PR, the n-type drift region ND, and the n-type drain region DR are not yet formed in the semiconductor substrate SB, the region in which these regions are formed is also configured by the p-type substrate region KB.

Next, as shown in FIG. 18 and FIG. 19, the STI region (element isolation region) 3 is formed on the semiconductor substrate SB using, for example, an STI method.

Next, the n-type drift region ND is formed in the semiconductor substrate SB (p-type substrate region KB) by an ion-implantation method. At this time, the n-type drift region ND in the element region 1A and the n-type drift region ND in the element region 2A are formed in the same ion-implantation step.

Next, the p-type body region PB is formed in the semiconductor substrate SB (p-type substrate region KB) by an ion-implantation method. At this time, the p-type body region PB in the element region 1A and the p-type body region PB in the element region 2A are formed in the same ion-implantation step.

Next, the gate electrode GE is formed on the semiconductor substrate SB via the gate dielectric film GF. This step includes a step of forming the gate dielectric film GF, a step of forming a conductive film (for example, a polycrystalline silicon film) for the gate electrode GE, and a step of patterning the conductive film for the gate electrode GE.

Next, the n-type source region SR is formed in the semiconductor substrate SB (p-type substrate region KB) by an ion-implantation method. At this time, the n-type source region SR in the element region 1A and the n-type source region SR in the element region 2A are formed by the same ion-implantation step.

Next, the p-type body contact region PR is formed in the semiconductor substrate SB (p-type substrate region KB) by an ion-implantation method. At this time, the p-type body contact region PR in the element region 1A and the p-type body contact region PR in the element region 2A are formed by the same ion-implantation step.

Next, the n-type drain region DR is formed in the semiconductor substrate SB (p-type substrate region KB) by an ion-implantation method. At this time, the n-type drain region DR in the element region 1A and the n-type drain region DR in the element region 2A are formed by the same ion-implantation step.

In this way, the structure shown in FIG. 18 and FIG. 19 is obtained, but the order of the steps so far can be changed as necessary.

Next, as shown in FIG. 20 and FIG. 21, the interlayer dielectric film IL is formed on the semiconductor substrate SB so as to cover the gate electrode GE. After the interlayer dielectric film IL is formed, the upper surface of the interlayer dielectric film IL can be polished by the CMP method or the like to improve the flatness of the interlayer dielectric film IL.

Next, contact holes are formed in the interlayer dielectric film IL, and then the plugs PG are formed in the contact holes.

Next, the wirings M1 are formed on the interlayer dielectric film IL. Thereafter, an upper interlayer dielectric film and wiring are further formed, but the explanation thereof is omitted here.

Threshold Voltage of LDMOSFET

The threshold voltage of the LDMOSFET 2 formed in the element region 2A is different from the threshold voltage of the LDMOSFET 1 formed in the element region 1A, and more specifically, the threshold voltage of the LDMOSFET 2 formed in the element region 2A is lower than the threshold voltage of the LDMOSFET 1 formed in the element region 1A. The reason for this is that the channel forming regions are different as the formation regions of the p-type body regions PB are different. This will be described below.

In the LDMOSFET 1 formed in the element region 1A, the surface layer portion of the semiconductor substrate SB under the gate electrode GE is configured by the n-type drift region ND, the p-type substrate region KB, and the p-type body region PB. An upper portion (upper layer portion) of the p-type body region PB located under the gate electrode GE and an upper portion (upper layer portion) of the p-type substrate region KB located under the gate electrode GE are the channel forming regions CN of the LDMOSFET 1. In the element region 1A, the width W1 of the p-type body region PB (PB1) overlapping with the gate electrode GE is substantially constant regardless of the location in the Y direction. Therefore, in the LDMOSFET 1 formed in the element region 1A, the impurity concentration distribution of the channel forming region is the same regardless of the position in the Y direction.

On the other hand, in the LDMOSFET 2 formed in the element region 2A, the width W1 of the p-type body region PB (PB2) overlapping with the gate electrode GE in the region RG2 having the cross-sectional structure of FIG. 9 or FIG. 15 is smaller than the width W1 of the p-type body region PB (PB2) overlapping with the gate electrode GE in the region RG1 having the cross-sectional structure of FIG. 8. Reflecting this, the ratio of the p-type body region PB2 to the channel forming region CN in the cross-sectional structure shown in FIG. 9 or FIG. 15 (and thus the region RG2) is smaller than the ratio of the p-type body region PB2 to the channel forming region CN in the cross-sectional structure shown in FIG. 8 (and thus the region RG1). In addition, the p-type body region PB2 does not contribute to the channel forming region CN in the cross-sectional structure (thus, the region RG2) shown in FIG. 15.

Therefore, in the LDMOSFET 2 formed in the element region 2A, the region RG1 and the region RG2 differ from each other in the impurity concentration distribution in the channel forming region CN. This makes it easier for the channels (n-type inversion layers) to be formed between the region RG1 and the region RG2. Specifically, the gate voltage required for forming the channels (n-type inversion layers) is lower in the region RG2 than in the region RG1. This is because, due to the fact that the gate voltage required to form the n-type inversion layer (channel) increases and the impurity concentration of the p-type body region PB is higher than the impurity concentration of the p-type substrate region KB as the p-type impurity concentration of the channel forming region CN increases, as the ratio of the p-type body region PB to the channel forming region CN decreases, the gate voltage required to form the n-type inversion layer (channel) decreases. Therefore, reducing the width W1 of the p-type body region PB overlapping with the gate electrode GE acts to lower the gate voltage required to form the channel.

That is, since the impurity concentration distributions in the channel forming regions in the region RG1 of the element region 2A and the element region 1A are the same as each other, the gate voltage required for forming the channel (n-type inversion layer) in the region RG1 of the element region 2A is substantially the same as the gate voltage required for forming the channel (n-type inversion layer) in the element region 1A. On the other hand, the impurity concentration distributions of the channel forming regions in the region RG2 of the element region 2A and the region RG1 of the element region 2A are different from each other, and the gate voltage required for forming the channel (n-type inversion layer) in the region RG2 of the element region 2A is lower than the gate voltage required for forming the channel (n-type inversion layer) in the region RG1 of the element region 2A. Therefore, the threshold voltage of the LDMOSFET 2 formed in the element region 2A where the region RG1 and the region RG2 are repeated in the Y direction is lower than the threshold voltage of the LDMOSFET 1 formed in the element region 1A where the same structure as the region RG1 extends in the Y direction.

If the element region 2A does not have the structure in the region RG2 and is configured only by the structure in the region RG1, the structure in the element region 2A becomes substantially the same as the structure in the element region 1A, so that the effective threshold voltage of the LDMOSFET 2 formed in the element region 2A becomes the same as the effective threshold voltage of the LDMOSFET 1 formed in the element region 1A. However, the element region 2A includes, in addition to the region RG1 having the cross-sectional structure of FIG. 8, the region RG2 in which a channel (n-type inversion layer) is more likely to be formed than the region RG1, and therefore, the effective threshold voltage of the LDMOSFET 2 formed in the element region 2A is lower than the effective threshold voltage of the LDMOSFET 1 formed in the element region 1A.

Therefore, in the present embodiment, the LDMOSFET 2 having the threshold voltage lower than the threshold voltage of the LDMOSFET 1 in the element region 1A can be formed in the element region 2A. In addition, the LDMOSFET 1 may be a normally-off type (enhancement type) LDMOSFET, and the LDMOSFET 2 may be a normally-off type (enhancement type) LDMOSFET the threshold voltage lower than the threshold voltage of the LDMOSFET 1, but in another embodiment, the LDMOSFET 2 may be a normally-on type (depletion type) LDMODFET.

Here, the cases of FIG. 7 and FIG. 9 are compared with the cases of FIG. 14 and FIG. 15. In FIG. 7 and FIG. 9, in the region RG2, the p-type body region PB2 overlaps with the gate electrode GE in plan view. Therefore, a part of the p-type body region PB2 is located under the gate electrode GE. On the other hand, in FIG. 14 and FIG. 15, in the region RG2, the p-type body region PB2 does not overlap with the gate electrode GE in plan view. Therefore, the p-type body region PB2 is not located under the gate electrode GE. Therefore, in the cases of FIG. 14 and FIG. 15, the gate voltage required to form the channel (n-type inversion layer) in the region RG2 of the element region 2A is lower than in the case of FIG. 7 and FIG. 9. This is because, in the cases of FIG. 7 and FIG. 9, the channel forming region CN in the region RG2 of the element region 2A is configured by the p-type substrate region KB and the p-type body region PB2 having an impurity concentration higher than that of the p-type substrate region KB, but in the cases of FIG. 14 and FIG. 15, the channel forming region CN is configured by the p-type substrate region KB, and the p-type body region PB2 does not function as the channel forming region CN in the region 2A. Therefore, the effective threshold voltage of the LDMOSFET 2 formed in the element region 2A can be made smaller in the cases of FIG. 14 and FIG. 15 than in the cases of FIG. 7 and FIG. 9.

Background of Consideration

The present inventors have studied forming MISFETs (here, LDMOSFETs) having threshold voltages different from each other on the same semiconductor substrate. As a method of adjusting the threshold voltage of the LDMOSFET, there is a method using channel-dope ion implantation. However, when the threshold voltage is adjusted by the channel-dope ion implantation, the channel-dope ion implantation step is required in each of the LDMOSFETs having threshold voltages different from each other, and thus the number of steps is increased. In addition, when the LDMOSFETs having threshold voltages different from each other are formed on the same semiconductor substrate using channel-dope ion implantation, a mask for the channel-dope ion implantation (a mask in which channel-dope ion implantation is blocked in one of the LDMOSFETs having threshold voltages different from each other) is required. This increases the manufacturing cost of the semiconductor device. In addition, the channel-dope ion implantation may affect the impurity concentration distribution of the above-described n-type drift region ND, and may reduce the electric characteristic (for example, the breakdown voltage) of the LDMOSFET.

Therefore, adjusting the threshold voltage of MISFET (LDMOSFET in this case) by a simple method without increasing the manufacturing cost of the semiconductor device is desired.

Main Features and Effects

The semiconductor device of the present embodiment includes the n-type source region SR and the n-type drain region DR of the LDMOSFET 2 formed spaced apart from each other in the p-type substrate region KB of the semiconductor substrate SB, and the gate electrode GE of the LDMOSFET 2 on the semiconductor substrate SB between the n-type source region SR and the n-type drain region DR via the gate dielectric film GF. The semiconductor device of the present embodiment further includes the p-type body region PB formed in the p-type substrate region KB of the semiconductor substrate SB so as to partially overlap with the gate electrode GE in plan view, and the p-type body contact region PR formed in the p-type substrate region KB of the semiconductor substrate SB so as not to overlap with the gate electrode GE in plan view and so as to be adjacent to the n-type source region SR. The impurity concentration of the p-type body region PB is higher than the impurity concentration of the p-type substrate region KB, and the impurity concentration of the p-type body contact region PR is higher than the impurity concentration of the p-type body region PB. The semiconductor device of the present embodiment further includes the n-type drift region ND formed in the p-type substrate region KB of the semiconductor substrate SB so as to partially overlap with the gate electrode GE in plan view and electrically connected to the n-type drain region DR. The impurity concentration of the n-type drift region ND is lower than the impurity concentration of the n-type drain region DR. The gate electrode GE extends in the Y direction, and the p-type body region PB extends in the Y direction so as to cover the bottom surface of the n-type source region SR and the bottom surface of the p-type body contact region PR.

One of the main features of the semiconductor device of the present embodiment is that, in the element region 2A in which the LDMOSFET 2 is formed, the region RG1 having the relatively large width W1 and the region RG2 having the relatively small width W1 are alternately disposed in the Y direction. That is, the semiconductor substrate SB includes the region RG1 and the region RG2 that are alternately disposed in the Y direction, and the width W1 in the region RG2 is smaller than the width W1 in the region RG1. Specifically, the region RG1 having the cross-sectional structure of FIG. 8 and the region RG2 having the cross-sectional structure of FIG. 9 or FIG. 15 are alternately disposed in the Y direction. As a result, as described in the column "THRESHOLD VOLTAGE OF LDMOSFET" above, the threshold voltage of the LDMOSFET 2 formed in the element region 2A can be adjusted to a desired threshold voltage.

That is, in the element region 2A, by applying a structure in which the region RG1 and the region RG2 are alternately disposed in the Y direction, the threshold voltage of the LDMOSFET 2 formed in the element region 2A can be made different from the LDMOSFET 1 formed in the element region 1A, and more specifically, can be made lower than the LDMOSFET 1 formed in the element region 1A.

Further, adjusting the dimension of each of the region RG1 and the region RG2 in the Y direction can control the threshold voltage of the LDMOSFET 2 in the element region 2A. For example, the smaller the dimension of the region RG1 in the Y direction and the larger the dimension of the region RG2 in the Y direction, the lower the threshold voltage of the LDMOSFET 2 tends to be. This is because the smaller the dimension of the region RG1 in the Y direction and the larger the dimension of the region RG2 in the Y direction, the higher the ratio of the region RG2 contributing to the effective threshold voltage of the LDMOSFET 2. Therefore, the LDMOSFET 2 having a desired threshold voltage can be formed by adjusting the dimension in the Y direction of each of the region RG1 and the region RG2 in the element region 2A in accordance with the threshold voltage required for the LDMOSFET 2.

Further, in the case where the structures of FIG. 14 and FIG. 15 are applied, it is easier to adjust the threshold voltage of the LDMOSFET 2 in the element region 2A than in the case where the structures of FIG. 7 and FIG. 9 are applied. Therefore, the difference between the threshold voltage of the LDMOSFET 1 formed in the element region 1A and the threshold voltage of the LDMOSFET 2 formed in the element region 2A can be made larger. This is because, in the case where the structures of FIG. 14 and FIG. 15 are applied, the difference between the gate voltage required to form the channel in the region RG1 of the element region 2A and the gate voltage required to form the channel in the region RG2 of the element region 2A becomes greater than in the case where the structures of FIG. 7 and FIG. 9 are applied.

First Modified Example

Figure 22:
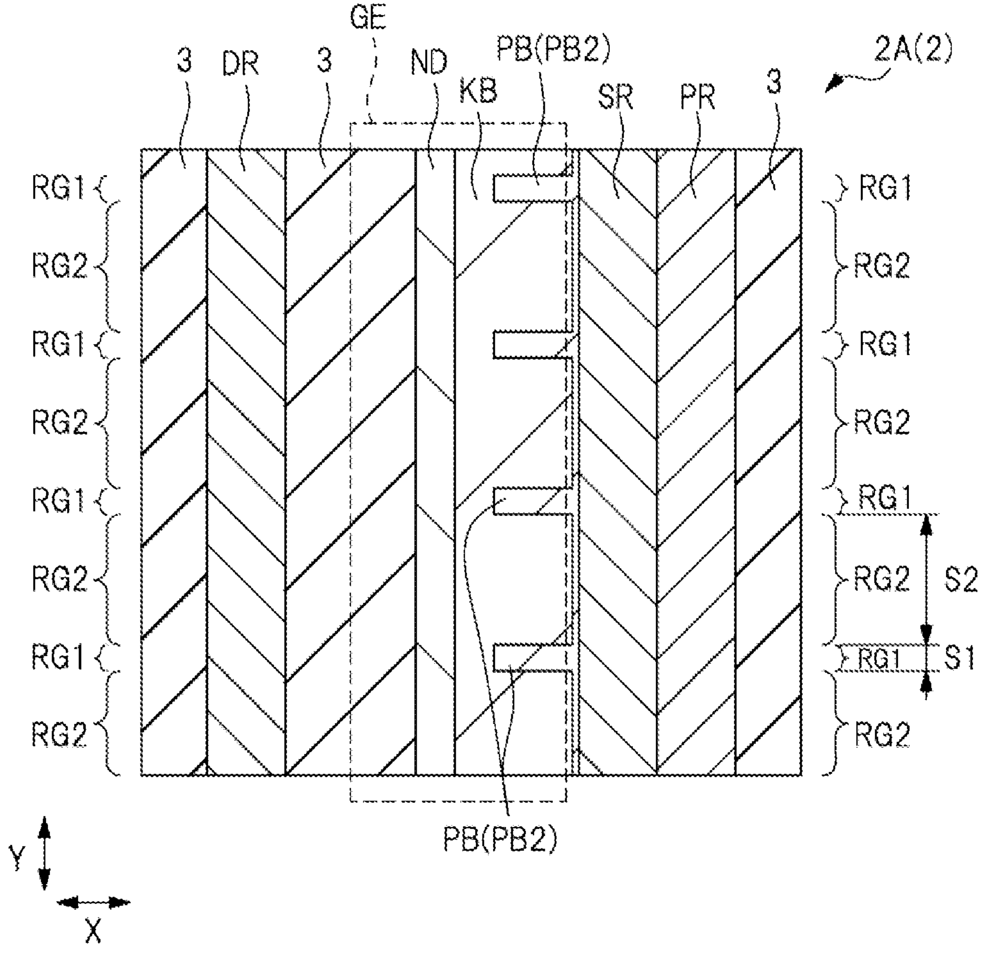
FIG. 22 is a main portion plan view of a semiconductor device of a first modified example.

FIG. 22 is a main portion plan view of the first modified example of the semiconductor device of the present embodiment. FIG. 22 corresponds to FIG. 14, and shows a plan view of the element region 1A. In FIG. 7 and FIG. 14, the case where the dimension (length) S1 in the Y direction of the region RG1 and the dimension (length) S2 in the Y direction of the region RG2 are substantially the same (i.e., in the case of S1=S2) is shown, on the other hand, in FIG. 22, the case where the dimension (length) S1 in the Y direction of the region RG1 is smaller than the dimension (length) S2 in the Y direction of the region RG2 (i.e., in the case of S1<S2) is shown. As compared with the case of FIG. 15, in the case of FIG. 22, the threshold voltage of the LDMOSFET 2 can be made lower because the ratio of the region RG2 contributing to the effective threshold voltage of the LDMOSFET 2 is increased.

In the present embodiment, the LDMOSFET 2 having the threshold voltage different from the threshold voltage of the LDMOSFET 1 formed in the element region 1A can be formed in the element region 2A. The formation regions of the p-type body regions PB are different between the LDMOSFET 1 in the element region 1A and the LDMOSFET 2 in the element region 2A, but this can be realized by adjusting the photoresist pattern used as the ion implantation element mask in the ion implantation step for forming the p-type body region PB. Therefore, the LDMOSFET 1 in the element region 1A and the LDMOSFET 2 in the element region 2A can be formed in the same step. As a result, the LDMOSFET 1 in the element region 1A and the LDMOSFET 2 in the element region 2A can be formed together without any additional steps occurring for the steps required to form the LDMOSFET 1 of the element region 1A.

Therefore, the threshold voltage of the LDMOSFET can be adjusted by a simple method. In addition, it is possible to adjust the threshold voltage of LDMOSFET while suppressing the manufacturing cost of the semiconductor device without increasing the manufacturing cost of the semiconductor device.

Further, if the p-type body region PB is not present in the element region 2A, the breakdown voltage of the LDMOSFET 2 may be lowered, but the presence of the p-type body region PB in the element region 2A facilitates securing the breakdown voltage of the LDMOSFET 2 in the present embodiment.

Second Modified Example

Next, further modified example of the semiconductor device of the present embodiment will be described.

Figure 23:
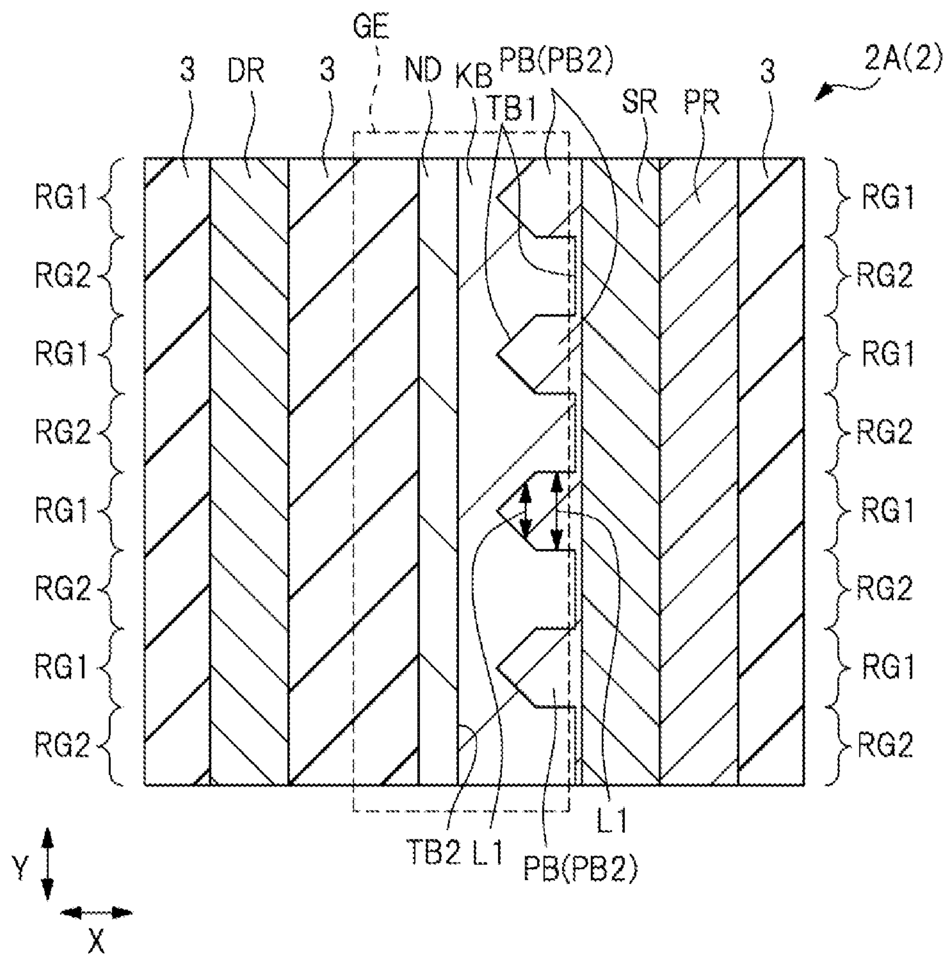
FIG. 23 is a main portion plan view of a semiconductor device of a second modified example.

FIG. 23 is a main portion plan view of the semiconductor device of the second modified example. FIG. 23 corresponds to FIG. 14, and shows a plan view of the element region 2A.

In the cases of FIG. 7 and FIG. 14, in the region RG1 of the element region 2A, the dimension L1 in the Y direction of the portion overlapping with the gate electrode GE in plan view in the p-type body region PB (PB2) is substantially constant regardless of the location in the X direction.

On the other hand, in FIG. 23, in the region RG1 of the element region 2A, the dimension L1 in the Y direction of the portion overlapping with the gate electrode GE in plan view in the p-type body region PB (PB2) is smallest at the end portion facing the n-type drift region ND and gradually increases as the distance from the n-type drift region ND increases. As compared with the case of FIG. 14, in the case of FIG. 23, a portion overlapping with the gate electrode GE in the p-type body region PB (PB2) in plan view is reduced, and the on-current of the LDMOSFET 2 easily flows, so that the threshold voltage of the LDMOSFET 2 can be made lower.

Third Modified Example

Figure 24:
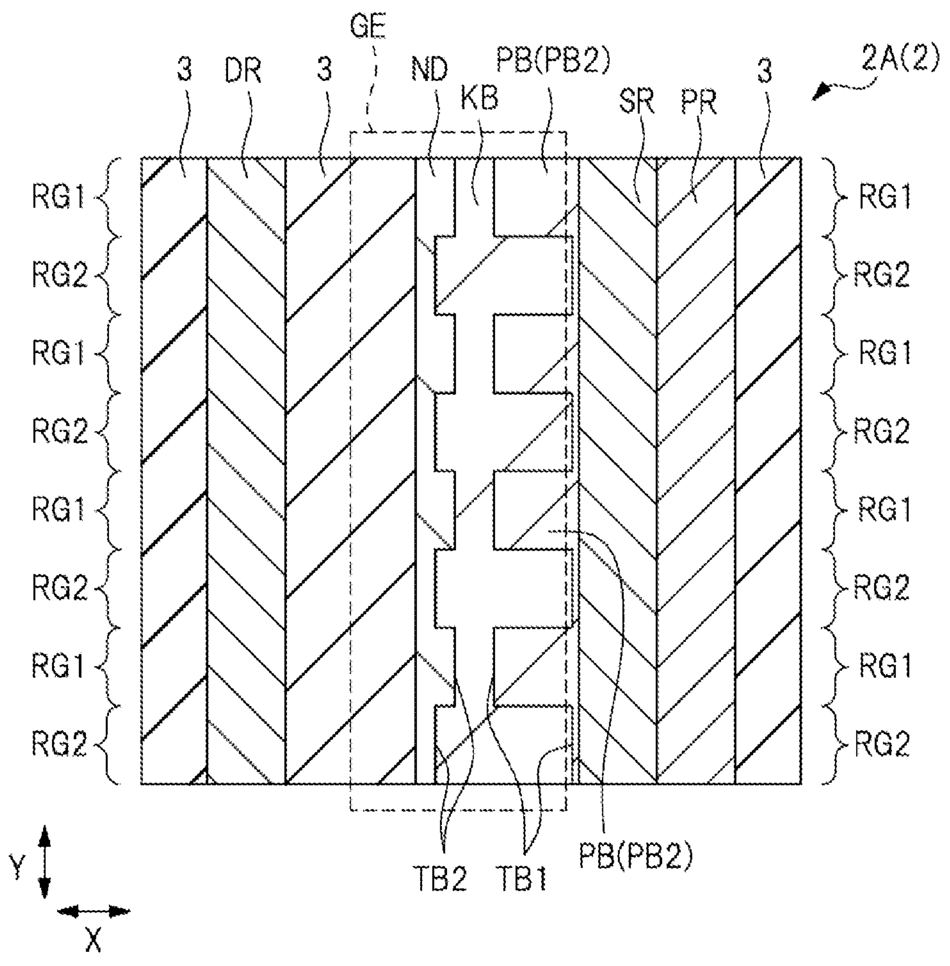
FIG. 24 is a main portion plan view of a semiconductor device of a third modified example.

FIG. 24 is a main portion plan view of the semiconductor device of the third modified example. FIG. 24 corresponds to the FIG. 14, and shows a plan view of the element region 2A.

In both of the case of FIG. 7 and the case of FIG. 14 and the case of FIG. 24, in the element region 2A, in the region RG2 as compared with the region RG1, the location (location in the X direction) of the end portion TB1 of the p-type body region PB facing the n-type drift region ND in plan view is retracted away from the n-type drift region ND.

In the case of FIG. 7 and the case of FIG. 14, in the element region 2A, in the region RG1 and the region RG2, the locations (locations in the X direction) of the end portions TB1 of the n-type drift regions ND facing the p-type body regions PB in plan view are the same as each other.

On the other hand, in FIG. 24, in the element region 2A, in the region RG2 as compared with the region RG1, the location (location in the X direction) of the end portion TB2 of the n-type drift region ND facing the p-type body region PB in plan view is retracted away from the p-type body region PB.

In the region RG2 of the element region 2A, since the p-type body region PB is not formed under the gate electrode GE, there is a concern that the breakdown voltage decreases due to the extension of the depletion layer from the drain to the source. On the other hand, in the case of FIG. 24, in the region RG2 as compared with the region RG1, the location (the location in the X direction) of the end portion TB2 of the n-type drift region ND facing the p-type body region PB in plan view is retracted away from the p-type body region PB, so that it is easy to suppress or prevent a decrease in the breakdown voltage caused by the extension of the depletion layer from the drain to the source.

Second Embodiment

Figure 25:
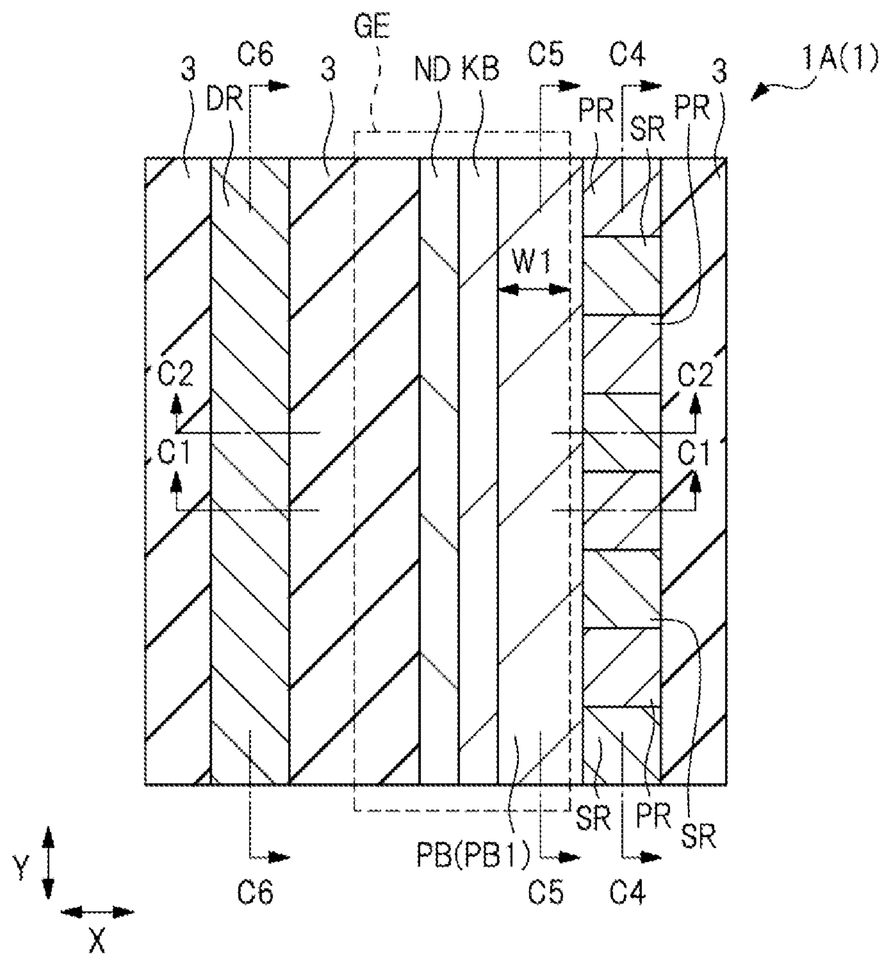
FIG. 25 is a main portion plan view of a semiconductor device of a second embodiment.
Figure 26:
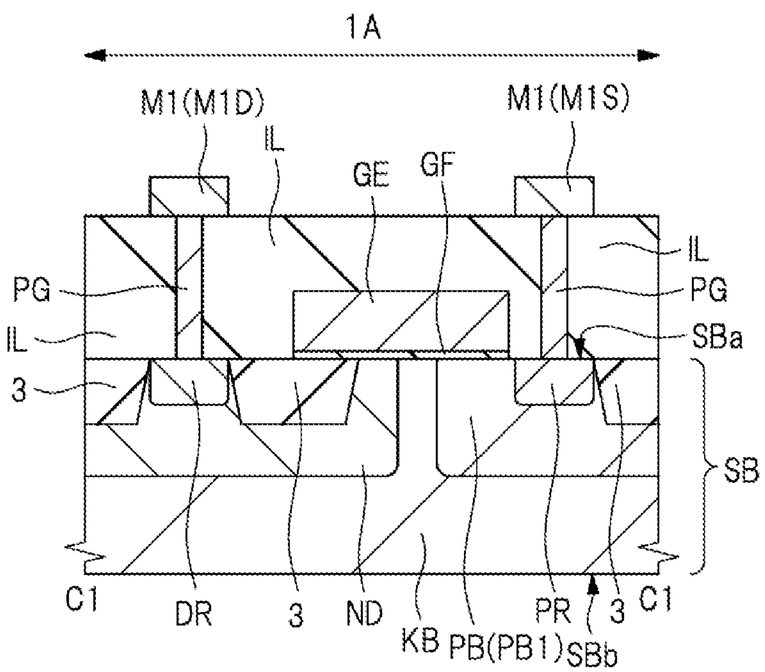
FIG. 26 is a main portion cross-sectional view of the semiconductor device of the second embodiment.
Figure 27:
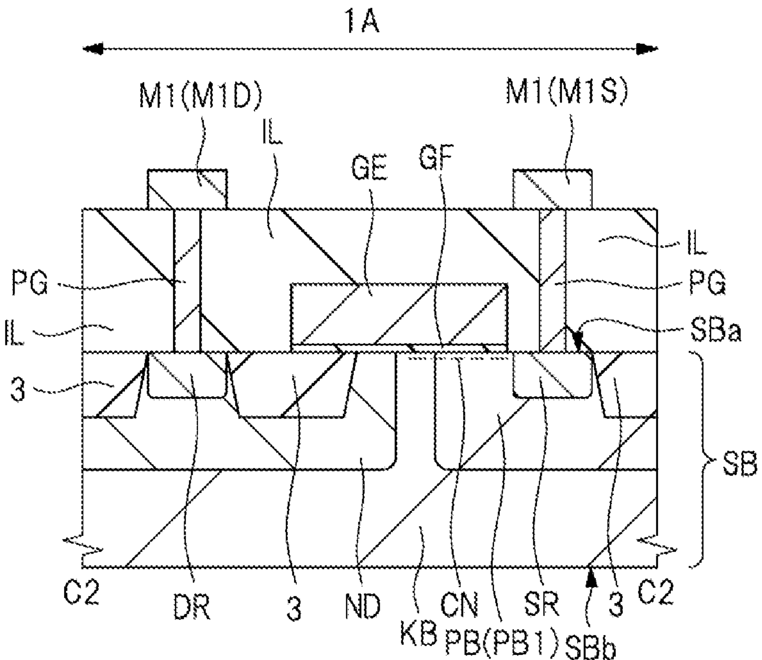
FIG. 27 is a main portion cross-sectional view of the semiconductor device of the second embodiment.
Figure 28:
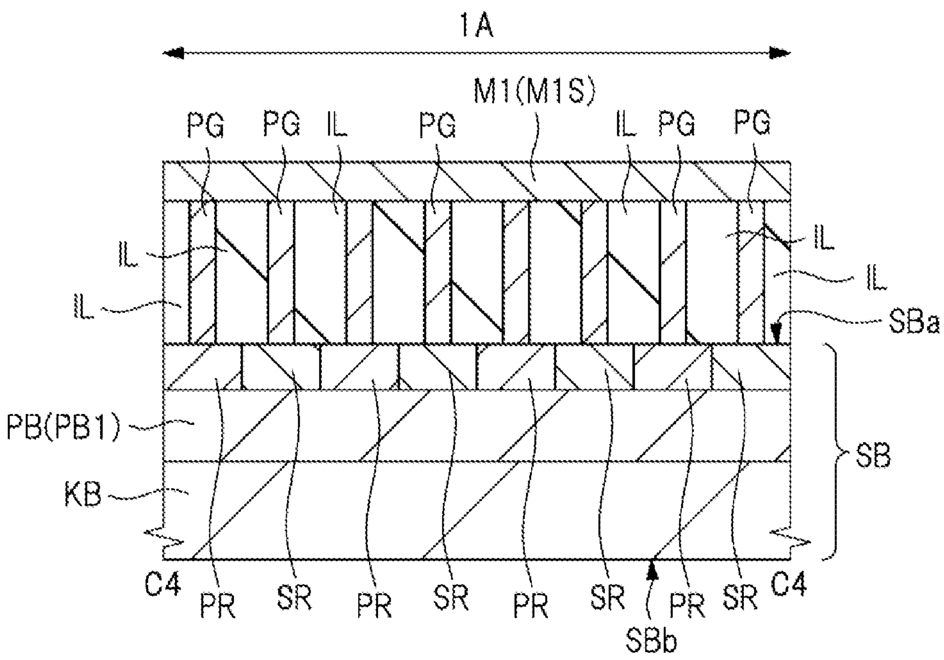
FIG. 28 is a main portion cross-sectional view of the semiconductor device of the second embodiment.
Figure 29:
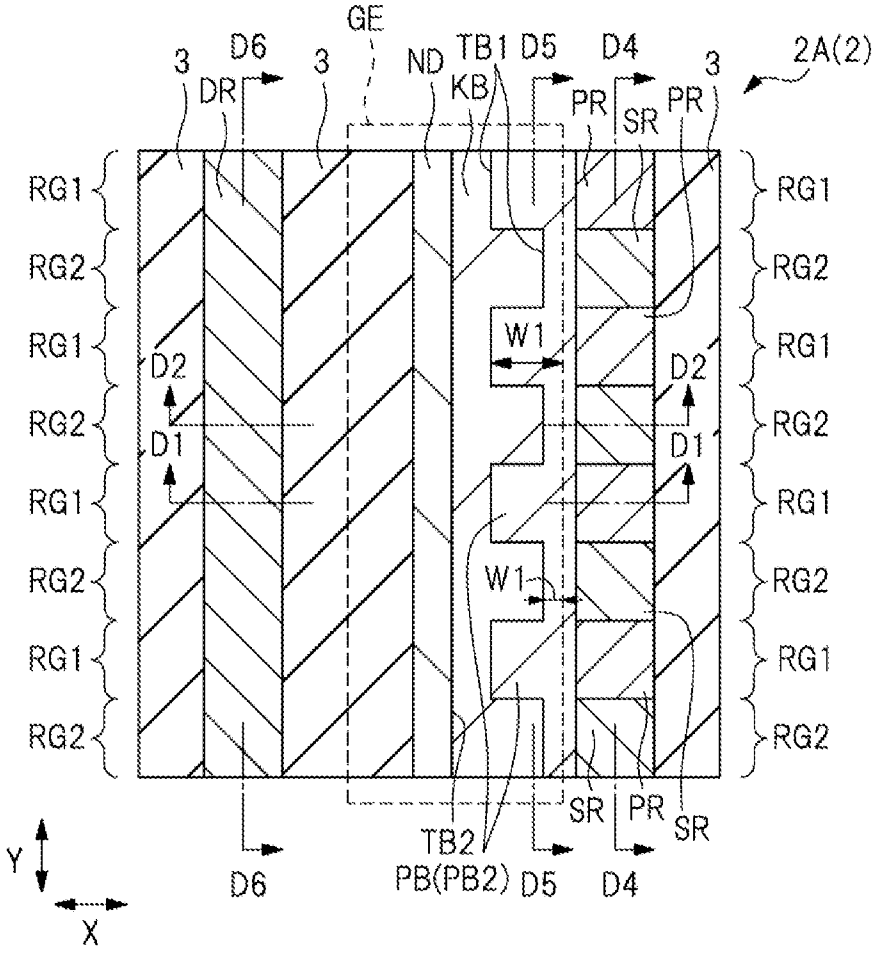
FIG. 29 is a main portion plan view of the semiconductor device of the second embodiment.

FIG. 25 and FIG. 29 are main portion plan views of the semiconductor device of the present second embodiment, and FIG. 26 to FIG. 28 and FIG. 30 to FIG. 32 are main portion cross-sectional views of the semiconductor device of the present second embodiment. FIG. 25 corresponds to FIG. 1 of the first embodiment, and shows a plan view of the element region 1A. FIG. 29 corresponds to FIG. 7 of the first embodiment, and shows a plan view of the element region 2A. The cross-sectional view along C1-C1 line of FIG. 25 substantially corresponds to FIG. 26, the cross-sectional view along C2-C2 line of FIG. 25 substantially corresponds to FIG. 27, and the cross-sectional view along C4-C 4 line of FIG. 25 substantially corresponds to FIG. 28. The cross-sectional view along C5-C5 line of FIG. 25 is similar to that in FIG. 5, and the cross-sectional view along C6-C6 line of FIG. 25 is similar to that in FIG. 6. In addition, the cross-sectional view along D1-D1 line of FIG. 29 substantially corresponds to FIG. 30, the cross-sectional view along D2-D2 line of FIG. 29 substantially corresponds to FIG. 31, and the cross-sectional view along D4-D4 line of FIG. 29 substantially corresponds to FIG. 32. The cross-sectional view along D5-D5 line of FIG. 29 is the same as that in FIG. 12, and the cross-sectional view along D6-D6 line of FIG. 29 is the same as that in FIG. 13.

Also in the present second embodiment, the formation region of the p-type body region PB in the structure of the semiconductor device in the element region 2A is different from that in the structure of the semiconductor device in the element region 1A, and the structure of the semiconductor device in the element region 2A is basically the same as the structure of the semiconductor device in the element region 1A except for the formation region of the p-type body region PB. Further, the n-type source region SR and the p-type body contact region PR in the semiconductor device of the present second embodiment is mainly different from those in the semiconductor device of the first embodiment, and other structures are basically the same between the first embodiment and the second embodiment.

The difference between the semiconductor device of the second embodiment and the semiconductor device of the first embodiment will be described below.

In the first embodiment, as shown in FIG. 1, FIG. 3, FIG. 4, FIG. 7, FIG. 10, and FIG. 11, in each of the element region 1A and the element region 2A, the n-type source region SR and the p-type body contact region PR extend in the Y direction and are adjacent to each other in the X direction. Note that, among the n-type source region SR and the p-type body contact region PR, the n-type source region SR is disposed on a side close to the channel forming region, and the p-type body contact region PR is disposed on a side far from the channel forming region.

On the other hand, in the semiconductor device of the present second embodiment, as shown in FIG. 25, FIG. 28, FIG. 29, and FIG. 32, the n-type source region SR and the p-type body contact region PR are alternately disposed in the Y direction in each of the element region 1A and the element region 2A. The p-type body region PB extends in the Y direction so as to cover the bottom surface of the n-type source region SR and the bottom surface of the p-type body contact region PR that are alternately disposed in the Y direction.

Figure 30:
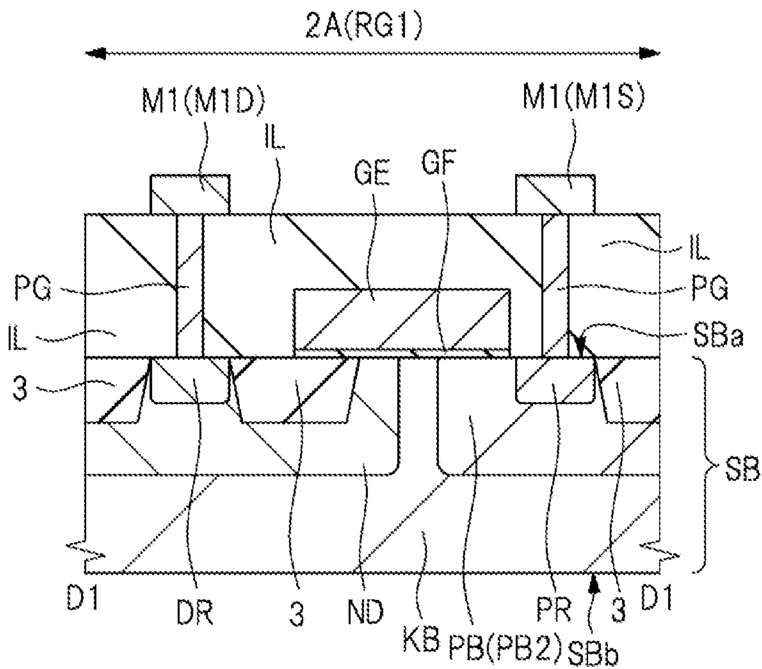
FIG. 30 is a main portion cross-sectional view of the semiconductor device of the second embodiment.

That the region RG1 of the element region 2A has the cross-sectional structure shown in FIG. 30 while a part of the p-type body region PB2 is located under the gate electrode GE (therefore, a part of the p-type body region PB2 overlaps with the gate electrode GE in plan view) is the same between the first embodiment and the present second embodiment.

In addition, that the width W1 of the p-type body region PB2 overlapping with the gate electrode GE in the region RG2 of the element region 2A is smaller than the width W1 of the p-type body region PB2 overlapping with the gate electrode GE in the region RG1 of the element region 2A is common between the first embodiment and the present second embodiment.

Figure 31:
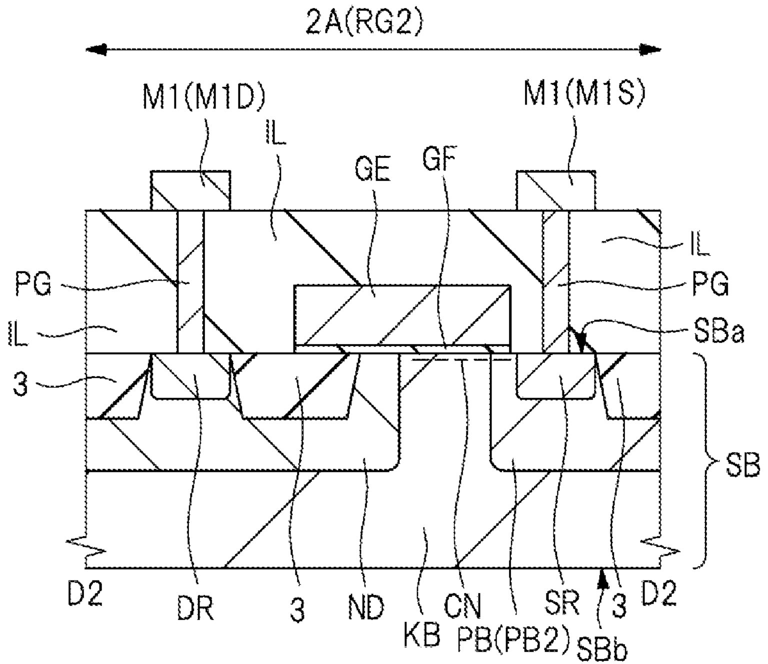
FIG. 31 is a main portion cross-sectional view of the semiconductor device of the second embodiment.
Figure 32:
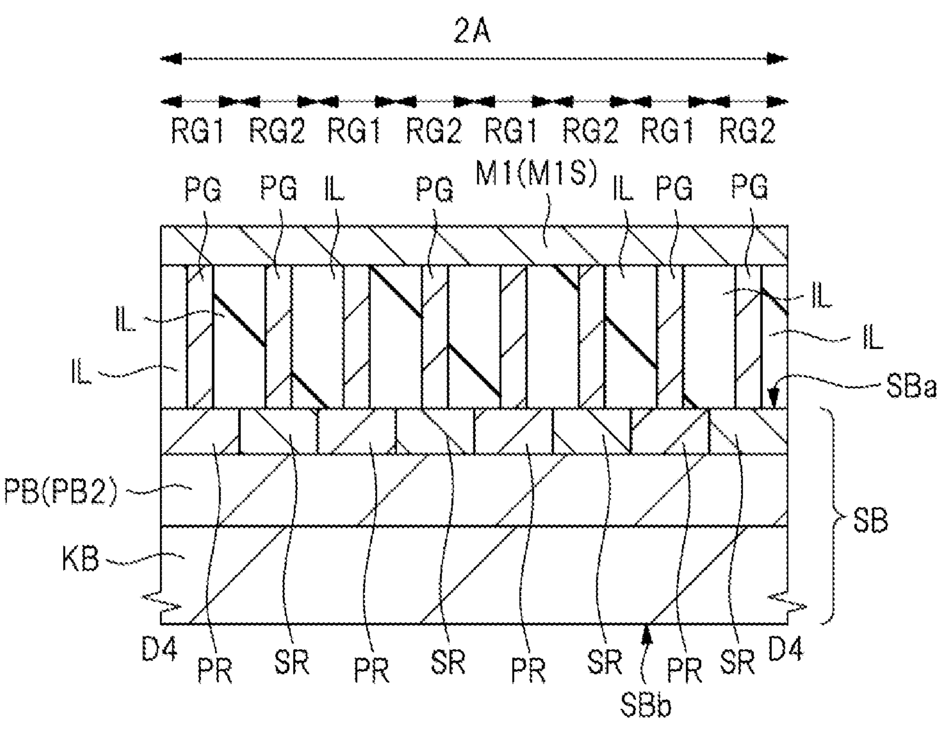
FIG. 32 is a main portion cross-sectional view of the semiconductor device of the second embodiment.
Figure 33:
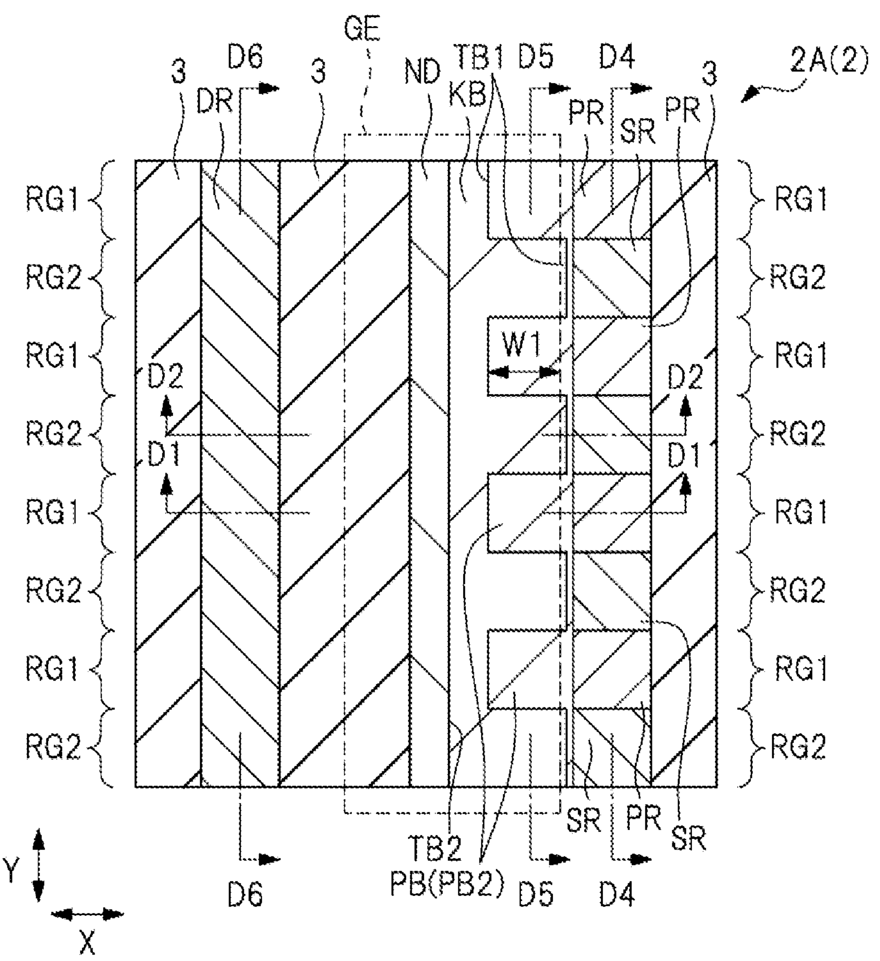
FIG. 33 is a main portion plan view of the semiconductor device of the second embodiment.
Figure 34:
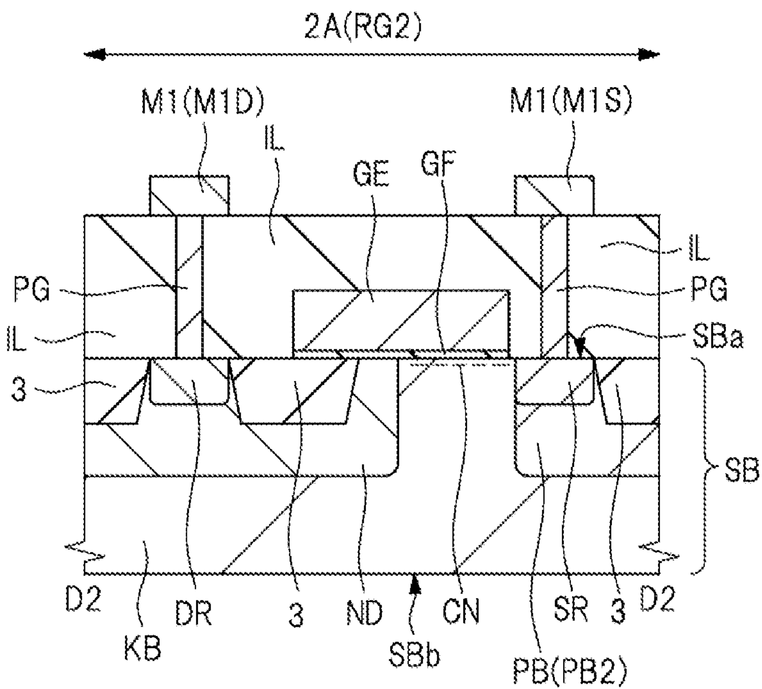
FIG. 34 is a main portion cross-sectional view of the semiconductor device of the second embodiment.

Similarly to the first embodiment, in the present second embodiment, the width W1 of the p-type body region PB2 overlapping with the gate electrode GE in the region RG2 of the element region 2A may be zero (W1=0). FIG. 33 and FIG. 34 are a plan view (FIG. 33) and a cross-sectional view (FIG. 34) of the element region 2A when the width W1 of the p-type body region PB2 overlapping the gate electrode GE in the region RG2 is zero (W1=0). FIG. 34 is a cross-sectional view along D2-D2 line of FIG. 33. The cross-sectional view along D1-D1 line of FIG. 33 is similar to that in FIG. 30, the cross-sectional view along D4-D4 line of FIG. 33 is similar to that in FIG. 32, the cross-sectional view along D5-D5 line of FIG. 33 is similar to that in FIG. 12, and the cross-sectional view along D6-D6 line of FIG. 33 is similar to that in FIG. 13. On the other hand, FIG. 29 and FIG. 31 show a plan view (FIG. 29) and a cross-sectional view (FIG. 31) of the element region 2A when the width W1 of the p-type body region PB2 overlapping with the gate electrode GE in the region RG2 is greater than zero (W1>0).

In FIG. 29, a part of the p-type body region PB2 overlaps with the gate electrode GE in the region RG2 in plan view. Therefore, as shown in FIG. 31, a part of the p-type body region PB2 is located under the gate electrode GE in the region RG2. In contrast, in FIG. 33, the p-type body region PB2 does not overlap with the gate electrode GE in the region RG2 in plan view. Therefore, as shown in FIG. 34, the p-type body region PB2 is not formed (located) under the gate electrode GE in the region RG2.

In the present second embodiment, the region RG1 and the RG2 are alternately disposed in the Y direction in the element region 2A, and the n-type source region SR and the p-type body contact region PR are alternately disposed in the Y direction. The p-type body contact region PR is formed in the region RG1, and the n-type source region SR is formed in the region RG2.

Other configurations of the semiconductor device of the second embodiment are substantially the same as those of the semiconductor device of the first embodiment, and therefore, repeated explanation thereof will be omitted here. In addition, since the manufacturing step of the semiconductor device of the present second embodiment is substantially the same as the manufacturing step of the semiconductor device of the first embodiment, repeated explanation thereof will be omitted here.

Also in the semiconductor device of the present second embodiment, in the element region 2A in which the LDMOSFET 2 is formed, the region RG1 having the relatively large width W1 and the region RG2 having the relatively small width W1 are alternately disposed in the Y direction. Specifically, the region RG1 having the cross-sectional structure of FIG. 30 and the region RG2 having the cross-sectional structure of FIG. 31 or FIG. 34 are alternately disposed in the Y direction. As described in the column "THRESHOLD VOLTAGE OF LDMOSFET" above, the channel (n-type inversion layer) is more likely to be formed in the region RG2 than in the region RG1. Therefore, also in the present second embodiment, the threshold voltage of the LDMOSFET 2 formed in the element region 2A can be adjusted to a desired threshold voltage.

Also in the present second embodiment, the LDMOSFET 2 having the threshold voltage different from the threshold voltage of the LDMOSFET 1 formed in the element region 1A can be formed in the element region 2A. Since the LDMOSFET 1 in the element region 1A and the LDMOSFET 2 in the element region 2A can be formed in the same step, the LDMOSFET 1 in the element region 1A and the LDMOSFET 2 in the element region 2A can be formed together without any additional steps. Therefore, the threshold voltage of the LDMOSFET can be adjusted by a simple method without increasing the manufacturing cost of the semiconductor device.

In the present second embodiment, the p-type body contact region PR is formed in the region RG1, and the n-type source region SR is formed in the region RG2. In this case, the current flowing between the n-type source region SR and the n-type drain region DR can efficiently flow through the channel (n-type inversion layer) formed in the region RG2 where the source region SR is formed. Therefore, when the region RG1 and the region RG2 are alternately disposed in the Y direction in the element region 2A and the n-type source region SR and the p-type body contact region PR are alternately disposed in the Y direction, the threshold voltage of the LDMOSFET 2 can be efficiently adjusted by forming the p-type body contact region PR in the region RG1 and forming the n-type source region SR in the region RG2.

The second embodiment can be combined with each of the modified examples of the first embodiment.

In the first embodiment and the second embodiment, the LDMOSFET is an n-channel type, but the first embodiment and present second embodiment and modified example thereof can be applied to the p-channel type LDMOSFET by reversing all the conductivity types.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:

a semiconductor substrate having an upper surface;

a substrate region of a first conductivity type formed in the semiconductor substrate;

a first MISFET formed on the upper surface of the semiconductor substrate;

a first source region of a second conductivity type opposite the first conductivity type and a first drain region of the second conductivity type, the first source region and the first drain region being formed in the substrate region and spaced apart from each other, the first source region and the first drain region being of the first MISFET;

a first gate electrode of the first MISFET formed on the semiconductor substrate between the first source region and the first drain region via a first gate dielectric film;

a first semiconductor region of the first conductivity type formed in the substrate region so as to partially overlap with the first gate electrode in plan view, the first semiconductor region having an impurity concentration higher than an impurity concentration of the substrate region;

a second semiconductor region of the first conductivity type formed in the substrate region so as not to overlap with the first gate electrode in plan view and so as to be adjacent to the first source region, the second semiconductor region having an impurity concentration higher than the impurity concentration of the first semiconductor region;

a third semiconductor region of the second conductivity type formed in the substrate region so as to partially overlap with the first gate electrode in plan view and electrically connected to the first drain region, the third semiconductor region having an impurity concentration lower than an impurity concentration of the first drain region; and an STI region formed at the upper surface of the semiconductor substrate, the STI region being formed in the third semiconductor region and disposed between the first drain region and the first source region, wherein the first gate electrode extends in a first direction along the upper surface of the semiconductor substrate, wherein the first semiconductor region extends in the first direction so as to cover a bottom surface of the first source region and a bottom surface of the second semiconductor region, wherein the semiconductor substrate includes a first region and a second region alternately disposed in the first direction, wherein a width of the first semiconductor region, between the first source region and an end portion facing the third semiconductor region of the first semiconductor region, overlapping with the first gate electrode in a second direction in the second region is smaller than a width of the first semiconductor region, between the first source region and the end portion facing the third semiconductor region of the first semiconductor region, overlapping with the first gate electrode in the second direction in the first region, wherein the first semiconductor region and the third semiconductor region are spaced apart from each other in the second direction, and wherein the second direction is orthogonal to the first direction and along the upper surface of the semiconductor substrate.

2. The semiconductor device according to claim 1, wherein a part of the first semiconductor region is located under the first gate electrode in cross sectional view orthogonal to the first direction in the first region while the first semiconductor region is not located under the first gate electrode in cross sectional view orthogonal to the first direction in the second region.

3. The semiconductor device according to claim 1, comprising:

an interlayer dielectric film formed on the semiconductor substrate so as to cover the first gate electrode; and a plurality of contact plugs buried in the interlayer dielectric film, wherein a first contact plug of the plurality of contact plugs is disposed on the first source region and electrically connected to the first source region, wherein a second contact plug of the plurality of contact plugs is disposed on the second semiconductor region and electrically connected to the second semiconductor region.

4. The semiconductor device according to claim 3, comprising:

a first wiring formed on the interlayer dielectric film, wherein the first contact plug and the second contact plug are electrically connected to the first wiring.

5. The semiconductor device according to claim 3, wherein a potential supplied from the first contact plug to the first source region and a potential supplied from the second contact plug to the second semiconductor region are the same as each other.

6. The semiconductor device according to claim 1, wherein in the first region, an upper part of the substrate region located under the first gate electrode and an upper part of the first semiconductor region located under the first gate electrode are channel forming regions of the first MISFET, and wherein in the second region, the upper part of the substrate region located under the first gate electrode is the channel forming region of the first MISFET.

7. The semiconductor device according to claim 1, wherein in plan view, a location of an end portion facing the third semiconductor region of the first semiconductor region in the second region is retracted away from the third semiconductor region than the location of the end portion facing the third semiconductor region of the first semiconductor region in the first region.

8. The semiconductor device according to claim 1, wherein each of the first source region and the second semiconductor region extends in the first direction, and wherein the first source region and the second semiconductor region are adjacent to each other in the second direction.

9. The semiconductor device according to claim 1, wherein a dimension of the first region in the first direction is smaller than a dimension of the second region in the first direction.

10. The semiconductor device according to claim 1, wherein in the first region, a dimension in the first direction of a portion where the first semiconductor region overlaps with the first gate electrode in plan view is the smallest at an end portion facing the third semiconductor region and gradually increases as the distance from the third semiconductor region increases.

11. The semiconductor device according to claim 1, wherein in plan view, a location of an end portion facing the first semiconductor region of the third semiconductor region in the second region is retracted away from the first semiconductor region than the location of the end portion facing the first semiconductor region of the third semiconductor region in the first region.

12. The semiconductor device according to claim 1, wherein the first MISFET is an LDMOSFET.

13. The semiconductor device according to claim 1, comprising:

a second MISFET formed at the upper surface of the semiconductor substrate, wherein a threshold voltage of the first MISFET and a threshold voltage of the second MISFET are different from each other.

14. The semiconductor device according to claim 13, comprising:

a second source region of the second conductivity type and a second drain region of the second conductivity type, the second source region and the second drain region being formed in the substrate region and spaced apart from each other, the second source region and the second drain region being of the second MISFET;

a second gate electrode of the second MISFET formed on the semiconductor substrate between the second source region and the second drain region via a second gate dielectric film;

a fourth semiconductor region of the first conductivity type formed in the substrate region so as to partially overlap with the second gate electrode in plan view, the fourth semiconductor region having an impurity concentration higher than the impurity concentration of the substrate region;

a fifth semiconductor region of the first conductivity type formed in the substrate region so as not to overlap with the second gate electrode in plan view and so as to be adjacent to the second source region, the fifth semiconductor region having an impurity concentration higher than the impurity concentration of the fourth semiconductor region; and a sixth semiconductor region of the second conductivity type formed in the substrate region so as to partially overlap with the second gate electrode in plan view and electrically connected to the second drain region, the sixth semiconductor region having an impurity concentration lower than an impurity concentration of the second drain region, wherein the second gate electrode extends in the first direction, and wherein the fourth semiconductor region extends in the first direction while overlapping with the second gate electrode with a constant width in plan view so as to cover a bottom surface of the second source region and a bottom surface of the fifth semiconductor region.

15. The semiconductor device according to claim 14, wherein the first conductivity type is a p-type, wherein the second conductivity type is an n-type, and wherein the threshold voltage of the second MISFET is lower than the threshold voltage of the first MISFET.

16. The semiconductor device according to claim 1, wherein the semiconductor substrate includes:

a substrate; and an epitaxial semiconductor layer formed on the substrate, wherein the epitaxial semiconductor layer is the substrate region.

17. The semiconductor device according to claim 1, wherein in the second direction, a smallest distance between the first semiconductor region and the third semiconductor region in the second region is greater than a smallest distance between the first semiconductor region and the third semiconductor region in the first region.

18. The semiconductor device according to claim 1, wherein in the second direction, an end portion of the first semiconductor region closest to the third semiconductor region in the second region is exposed from the first gate electrode.

19. A semiconductor device comprising:

a semiconductor substrate having an upper surface;

a substrate region of a first conductivity type formed in the semiconductor substrate;

a first MISFET formed at the upper surface of the semiconductor substrate;

a first source region of a second conductivity type opposite the first conductivity type and a first drain region of the second conductivity type, the first source region and the first drain region being formed in the substrate region and spaced apart from each other, the first source region and the first drain region being of the first MISFET;

a first gate electrode of the first MISFET formed on the semiconductor substrate between the first source region and the first drain region via a first gate dielectric film;

a first semiconductor region of the first conductivity type formed in the substrate region so as to partially overlap with the first gate electrode in plan view, the first semiconductor region having an impurity concentration higher than an impurity concentration of the substrate region;

a second semiconductor region of the first conductivity type formed in the substrate region so as not to overlap with the first gate electrode in plan view and so as to be adjacent to the first source region, the second semiconductor region having an impurity concentration higher than the impurity concentration of the first semiconductor region; and a third semiconductor region of the second conductivity type formed in the substrate region so as to partially overlap with the first gate electrode in plan view and electrically connected to the first drain region, the third semiconductor region having an impurity concentration lower than an impurity concentration of the first drain region, wherein the first gate electrode extends in a first direction along the upper surface of the semiconductor substrate, wherein the first semiconductor region extends in the first direction so as to cover a bottom surface of the first source region and a bottom surface of the second semiconductor region, wherein the semiconductor substrate includes a first region and a second region alternately disposed in the first direction, wherein a width of the first semiconductor region overlapping with the first gate electrode in a second direction in the second region is smaller than a width of the first semiconductor region overlapping with the first gate electrode in the second direction in the first region, wherein the second direction is orthogonal to the first direction and along the upper surface of the semiconductor substrate, wherein in the first region, an upper part of the substrate region located under the first gate electrode and an upper part of the first semiconductor region located under the first gate electrode are channel forming regions of the first MISFET, and wherein in the second region, the upper part of the substrate region located under the first gate electrode is the channel forming region of the first MISFET.

* * * * *